US009218997B2

(12) United States Patent
Jun et al.

(10) Patent No.: US 9,218,997 B2
(45) Date of Patent: Dec. 22, 2015

(54) ELECTROSTATIC CHUCK HAVING REDUCED ARCING

(75) Inventors: Seok Yul Jun, OSan-Si (KR); Bum Jin Park, Seoul (KR); Sun Il Kim, Giheung-gu (KR); Hyong Seok Oh, Seoul (KR); Sung Chul Cho, Gyeonggi (KR); Young Sam Na, O-San (KR); Yeon Sang Cho, Seongnam-si (KR); Ha Sung Song, Gyeonggi-do (KR); Seong Ju Kim, Kyung Ki Do (KR); Hee Sang Chae, Gyeonggi (KR); Talex Sajoto, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1585 days.

(21) Appl. No.: 12/270,187

(22) Filed: Nov. 13, 2008

(65) Prior Publication Data

US 2010/0109263 A1    May 6, 2010

Related U.S. Application Data

(60) Provisional application No. 61/112,087, filed on Nov. 6, 2008.

(51) Int. Cl.
| | |
|---|---|
| *C23C 16/50* | (2006.01) |
| *C23C 16/00* | (2006.01) |
| *C23F 1/00* | (2006.01) |
| *H01L 21/306* | (2006.01) |
| *H01L 21/683* | (2006.01) |

(Continued)

(52) U.S. Cl.
CPC ...... *H01L 21/6831* (2013.01); *H01L 21/67103* (2013.01); *H02N 13/00* (2013.01); *Y10T 29/49986* (2015.01); *Y10T 279/23* (2015.01)

(58) Field of Classification Search
USPC ......... 118/715, 728–733; 156/345.51–345.55
See application file for complete search history.

(56) References Cited

U.S. PATENT DOCUMENTS

| | | |
|---|---|---|
| 5,715,132 A | 2/1998 | Steger et al. |
| 5,720,818 A | 2/1998 | Donde et al. |

(Continued)

FOREIGN PATENT DOCUMENTS

KR    10-1999-0079611 A    11/1999

OTHER PUBLICATIONS

Office Action from the Korean Intellectual Property Office received Oct. 5, 2010 for Korean Patent Application No. 10-2008-0113407.

(Continued)

*Primary Examiner* — Maureen Passey
*Assistant Examiner* — Tiffany Nuckols
(74) *Attorney, Agent, or Firm* — Moser Taboada; Alan Taboada

(57) ABSTRACT

Electrostatic chucks and methods of manufacturing the same are provided herein. In some embodiments, an electrostatic chuck comprises an electrically conductive body having one or more channels formed in an upper surface thereof; a plate positioned within the one or more channels to define one or more plenums between the body and the plate, wherein the surfaces of the plenum are anodized; one or more fluid passages disposed in the plate and fluidly coupling the one or more plenums to the upper surface of the body, wherein the surfaces of the fluid passages are electrically insulated; and a dielectric layer disposed over the upper surface of the body and the plate, wherein the dielectric layer forms a support surface for a substrate to be disposed thereon.

14 Claims, 16 Drawing Sheets

(51) Int. Cl.
*H01L 21/67* (2006.01)
*H02N 13/00* (2006.01)

(56) References Cited

U.S. PATENT DOCUMENTS

| | | | |
|---|---|---|---|
| 5,883,778 A | 3/1999 | Sherstinsky et al. | |
| 5,904,776 A | 5/1999 | Donde et al. | |
| 6,108,189 A * | 8/2000 | Weldon et al. | 361/234 |
| 6,263,829 B1 * | 7/2001 | Schneider et al. | 118/723 I |
| 6,310,755 B1 | 10/2001 | Kholodenko et al. | |
| 6,370,006 B1 | 4/2002 | Kumar et al. | |
| 6,414,834 B1 | 7/2002 | Weldon et al. | |
| 6,471,779 B1 * | 10/2002 | Nishio et al. | 118/724 |
| 6,490,145 B1 | 12/2002 | Kholodenko et al. | |
| 6,572,814 B2 | 6/2003 | Shamoulian et al. | |
| 6,581,275 B2 | 6/2003 | Narendrnath et al. | |
| 6,606,234 B1 | 8/2003 | Divakar | |
| 6,639,783 B1 | 10/2003 | Shamouilian et al. | |
| 6,721,162 B2 | 4/2004 | Weldon et al. | |
| 6,917,508 B2 | 7/2005 | Kim et al. | |
| 6,920,915 B1 * | 7/2005 | Shih et al. | 165/47 |
| 2002/0095782 A1 | 7/2002 | Narendrnath et al. | |
| 2002/0135969 A1 | 9/2002 | Weldon et al. | |
| 2003/0037883 A1 | 2/2003 | Mett et al. | |
| 2004/0190215 A1 | 9/2004 | Weldon et al. | |
| 2005/0092438 A1 * | 5/2005 | Hur et al. | 156/345.47 |
| 2005/0105243 A1 | 5/2005 | Lee et al. | |
| 2009/0034147 A1 | 2/2009 | Narendrnath et al. | |
| 2009/0034148 A1 | 2/2009 | Lubomirsky et al. | |
| 2009/0034149 A1 | 2/2009 | Lubomirsky et al. | |

OTHER PUBLICATIONS

Notice of Allowance from the Korean Intellectual Property Office received Dec. 24, 2010 for Korean Patent Application No. 10-2008-0113407.

* cited by examiner

ELECTROSTATIC CHUCK HAVING REDUCED ARCING

CROSS-REFERENCE TO RELATED APPLICATIONS

This application claims the benefit of U.S. Provisional Patent Application entitled "ELECTROSTATIC CHUCK HAVING REDUCED ARCING," having Ser. No. 61/112,087, and filed Nov. 6, 2008, which is hereby incorporated by reference.

BACKGROUND

1. Field

Embodiments of the present invention generally relate to equipment for performing semiconductor device fabrication, and more particularly, to an electrostatic chuck for supporting a semiconductor wafer during processing.

2. Description of the Related Art

Electrostatic chucks are widely used for providing support to substrates (also referred to herein as semiconductor wafers or wafers) within semiconductor processing equipment such as a plasma processing chamber. An electrostatic chuck generally holds a substrate in a stationary position during processing of the substrate, i.e., during material deposition or etching. Electrostatic chucks utilize capacitive and Johnsen-Rahbeck attractive forces for holding the substrate in position.

One type of electrostatic chuck includes a body and a fluid distribution element covered with a layer of a dielectric material thereby forming a support surface. The body is generally conductive such that the body forms an electrode of the electrostatic chuck. A substrate is placed onto the support surface. The fluid distribution element includes a plenum that carries the fluid through multiple passages formed in the support surface of the electrostatic chuck for distributing a heat transfer fluid such as a gas between the support surface of the chuck and the backside of the substrate. Generally, the gas fills the interstitial area between the electrostatic chuck and the substrate, thus enhancing the rate and uniformity of heat transfer between electrostatic chuck and the substrate.

In plasma processing chambers, the electrostatic chuck is subjected to high power radio frequency (RF) fields and high density plasmas in the vicinity of the substrate. In such plasma processing chambers, it is possible to have the gas breakdown due to high electric field generation in the gas passages. The operation and service life of the electrostatic chuck is adversely affected by plasma formation in the gas passages. Such plasma may damage the substrate, the electrostatic chuck or both. Furthermore, plasma formation in a gas passage can lead to arcing that forms particulate contaminants in the chamber.

Some conventional electrostatic chucks (ESC) have arcing problems around backside gas holes and lift pin holes. The base of the ESC, which is bare aluminum, is located just below a top ceramic layer and is too close to the ESC surface as a result of how the backside gas holes are made. If a wafer is not centered correctly on the ESC or if the chucking power is lost, then all RF Power (Plasma) passes through the lowest resistance point, which is the bare aluminum, and creates a lot of arcing.

In addition, when the lift pins move up and down, they rub against the lift pin hole areas, which are made of aluminum, which causes formation of aluminum particles. These aluminum particles act as an RF antenna and attract the RF Power and hence also cause arcing.

Accordingly, there is need in the art for an improved electrostatic chuck.

SUMMARY

Electrostatic chucks (ESC) having improved arcing resistance and methods of formation of same are provided herein. In some embodiments, and as discussed in further detail below, the improved ESC may include at least one of an overlap design and appropriate anodization process steps to prevent arcing; a ceramic bushing to prevent particle generation as a result of lift pin movement; appropriate helium hole design (number of holes, type of holes, size of holes, and location of holes) to improve temperature profile/uniformity, process reliability, part design/manufacturing/repair-ability/service-ability; round-shape embossing on an upper surface of the ESC to reduce particle generation from sharp corners or edges during substrate chucking and dechucking processes.

In some embodiments, an ESC may be provided having no bare aluminum areas where arcing issues may arise. For example, in some embodiments, the backside gas (helium) holes may be insulated using insulator materials such as ceramic bushings, porous ceramic, and anodizing. Thus, even if a wafer is improperly positioned on the ESC, there will be no arcing at the hole location. In some embodiments, the lift pin hole area are also insulated by, for example, inserting a ceramic bushing or anodizing the surface.

In some embodiments, an electrostatic chuck comprises an electrically conductive body having one or more channels formed in an upper surface thereof; a plate positioned within the one or more channels to define one or more plenums between the body and the plate, wherein the surfaces of the plenum are anodized; one or more fluid passages disposed in the plate and fluidly coupling the one or more plenums to the upper surface of the body, wherein the surfaces of the fluid passages are electrically insulated; and a dielectric layer disposed over the upper surface of the body and the plate, wherein the dielectric layer forms a support surface for a substrate to be disposed thereon.

In some embodiments, an apparatus for processing a substrate includes a chamber defining a process region; an electrostatic chuck for retaining a substrate in the process region, the electrostatic chuck including an electrically conductive body having one or more channels formed in an upper surface thereof; a plate positioned within the one or more channels to define one or more plenums between the body and the plate, wherein the surfaces of the plenum are anodized; one or more fluid passages disposed in the plate and fluidly coupling the one or more plenums to the upper surface of the body, wherein the surfaces of the fluid passages are electrically insulated; and a dielectric layer disposed over the upper surface of the body and the plate, wherein the dielectric layer forms a support surface for a substrate to be disposed thereon.

In some embodiments, a method of making an electrostatic chuck includes providing a body having one or more channels formed in an upper surface thereof; anodizing the one or more channels; providing a plate having one or more fluid passages disposed therethrough and having a lower surface portion that, when positioned within the one or more channels, defines one or more plenums that are each fluidly coupled to at least some of the one or more fluid passages; anodizing interior surfaces of the one or more fluid passages and the lower surface portion; and inserting the anodized plate into the one or more anodized channels of the body to form the one or more plenums.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
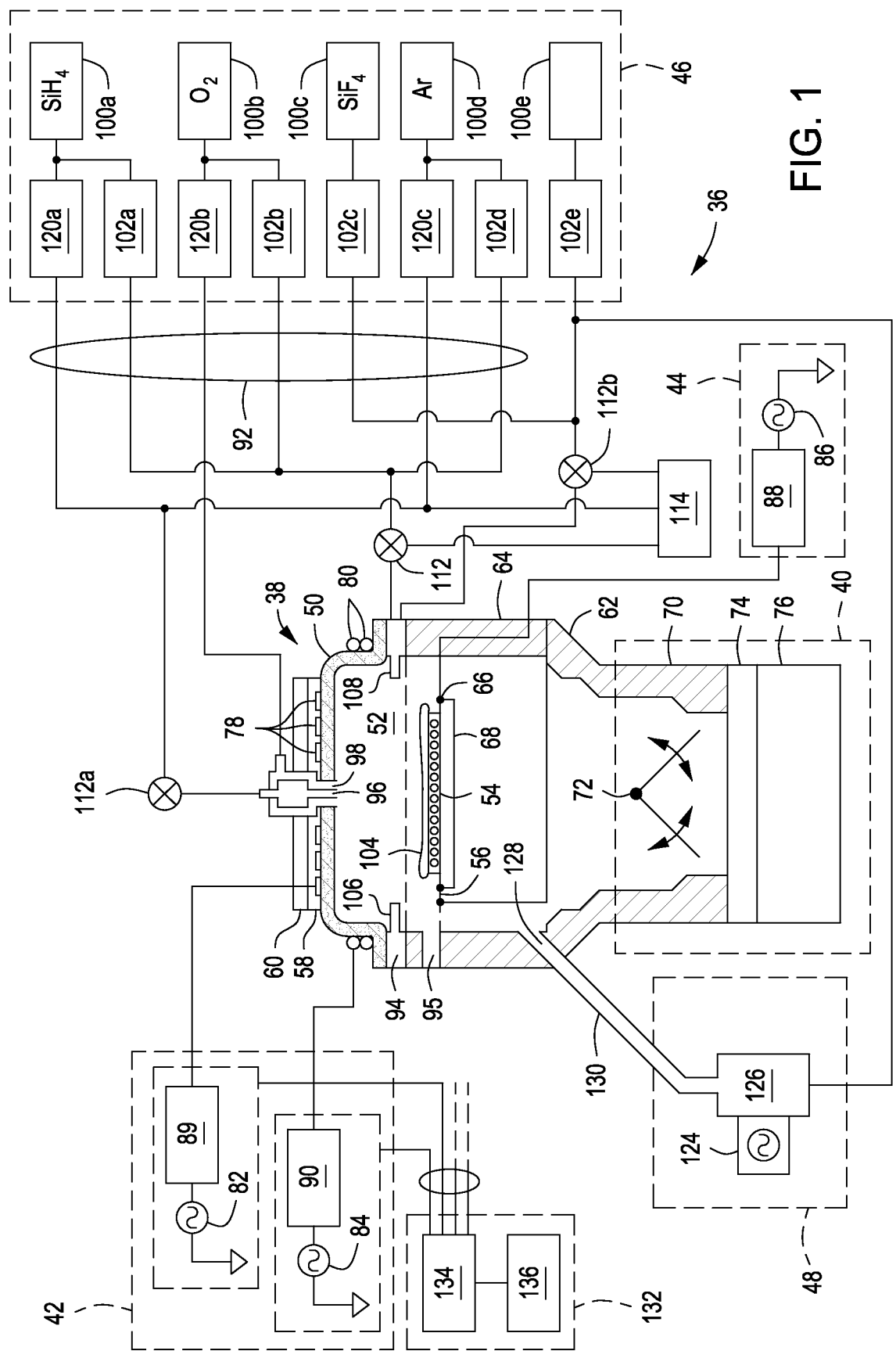
FIG. 1 illustrates a plasma-based substrate processing system comprising an electrostatic chuck having a fluid distribution element according to various embodiments of the present invention.

The drawings have been simplified to more clearly illustrate the invention and are not to scale. While the invention is described herein by way of example using several embodiments and illustrative drawings, those skilled in the art will recognize that the invention is not limited to the embodiments of drawing or drawings described. It should be understood that the drawings and detailed description thereto are not intended to limit the invention to the particular form disclosed, but on the contrary, the invention is to cover all modification, equivalents and alternatives falling within the spirit and scope of the present invention as defined by the appended claims. The headings used herein are for organizational purposes only and are not meant to be used to limit the scope of the description or the claims. Similarly, the words "include," "including," and "includes" mean including, but not limited to. Further, the words "a" or "an" means "at least one" unless otherwise mentioned.

DETAILED DESCRIPTION

Electrostatic chucks (ESC) having improved arcing resistance and methods of formation of same are provided herein. In some embodiments, and as discussed in further detail below, the improved ESC may include at least one of an overlap design and appropriate anodization process steps to prevent arcing; a ceramic bushing to prevent particle generation as a result of lift pin movement; appropriate helium hole design (number of holes, type of holes, size of holes, and location of holes) to improve temperature profile/uniformity, process reliability, part design/manufacturing/repair-ability/service-ability; round-shape embossing on an upper surface of the ESC to reduce particle generation from sharp corners or edges during substrate chucking and dechucking processes.

In some embodiments, an ESC may be provided having no bare aluminum areas where arcing issues may arise. For example, in some embodiments, the backside gas (helium) holes may be insulated using insulator materials such as ceramic bushings, porous ceramic, and anodizing to form insulating anodized surfaces. Thus, even if a wafer is improperly positioned on the ESC, there will be no arcing at the hole location. In some embodiments, the lift pin hole area are also insulated by, for example, inserting a ceramic bushing or anodizing the surface.

FIGS. 1-10 depict exemplary electrostatic chucks and methods of fabrication in accordance with some embodiments of the present invention and which may be modified in accordance with some embodiments of the invention, as discussed below with respect to FIGS. 11-19. For example, as depicted in embodiments illustrated in FIGS. 11-19, anodizing methods may be utilized to form an anodized surface and/or anodized layer on interior surfaces and/or sidewalls of fluid passages disposed in a plate, on a lower portion of the plate that forms a plenum, and/or on the interior surfaces of a channel which form a plenum. The anodizing methods may be used in combination with the methods described in FIGS. 1-10, for example, the interior surfaces of the plenum may be anodized and the fluid passages may have a dielectric tube (FIG. 15) or a porous dielectric insert (FIG. 16) disposed therein. Other variants, and methods of manufacturing are discussed below with respect to FIGS. 11-19.

FIG. 1 illustrates a plasma-based substrate processing system 36 comprising an electrostatic chuck 68 according to various embodiments of the present invention. The plasma processing system 36 is used for temperature controlled processing of substrates, such as Silicon wafers, GaAs wafers and the like, while creating and maintaining a plasma environment in which to process the substrates. The plasma is created in the vicinity of the substrate for processing the substrate, and the temperature of the substrate is controlled using various techniques, such as, by supplying a heat transfer fluid to the back surface of the substrate. Although one embodiment of a plasma processing chamber is described illustratively in a high density plasma-chemical vapor deposition (HDP-CVD) system such as the 300 mm HDP-CVD Ultima X system available from Applied Materials, Inc. of Santa Clara, Calif., the invention has utility in other process chambers where plasma is used including physical vapor deposition chambers, chemical vapor deposition chambers, etch chambers and other applications where a temperature control of a substrate is desired.

FIG. 1 illustrates one embodiment of a HDP-CVD system 36, in which an electrostatic chuck 68 is used to secure a substrate during processing. In accordance with embodiments of the present invention, the electrostatic chuck 68 is designed to reduce plasma penetration and arcing proximate the chuck 68.

The system 36 includes a process chamber 38, a vacuum system 40, a source plasma system 42, a bias plasma system 44, a gas delivery system 46, and a remote plasma cleaning system 48.

An upper portion of process chamber 38 includes a dome 50, which is made of a dielectric material, such as alumina or aluminum nitride. The dome 50 defines an upper boundary of a plasma processing region 52. The plasma processing region 52 is bounded on the bottom by the upper surface of substrate 54 and the substrate support member 56.

A heater plate 58 and a cold plate 60 surmount, and are thermally coupled to, the dome 50. The heater plate 58 and the cold plate 60 allow control of the dome temperature to within about +/−10 degree Centigrade over a range of about 100 to 200 degree Centigrade. This allows optimizing the dome temperature for the various processes. For example, it may be desirable to maintain the dome at a higher temperature for cleaning or etching processes than for deposition processes. Accurate control of the dome temperature also reduces the flake or particle counts in the process chamber and improves adhesion between the deposited layer and the substrate.

The lower portion of process chamber 38 includes a body member 62, which joins the process chamber to the vacuum system. A base portion 64 of the substrate support member 56 is mounted on, and forms a continuous inner surface with, body member 62. Substrates are transferred into and out of process chamber 38 by a robot blade (not shown) through an insertion/removal opening 95 in the side of process chamber 38. A pneumatic actuator (not shown) raises and lowers a lift-pin plate (not shown) that raises and lowers lift pins (not shown) that raise and lower the wafer. Upon transfer into process chamber 38, substrates are loaded onto the raised lift pins, and then lowered to a substrate receiving portion 66 of substrate support member 56. Substrate receiving portion 66 includes an electrostatic chuck 68 that secures the substrate to substrate support member 56 during substrate processing.

The vacuum system 40 includes a throttle body 70, which houses multi-blade throttle valve 72 and is attached to gate valve 74 and turbomolecular pump 76. It should be noted that throttle body 70 offers minimum obstruction to gas flow, and allows symmetric pumping, as described in co-pending, commonly assigned U.S. patent application, originally filed on filed Dec. 12, 1995, and assigned Ser. No. 08/574,839, refiled on Sep. 11, 1996 and assigned Ser. No. 08/712,724 entitled "SYMMETRIC CHAMBER". The gate valve 74 can isolate the pump 76 from the throttle body 70, and can also control process chamber pressure by restricting the exhaust flow capacity when throttle valve 72 is fully open. The arrangement of the throttle valve 72, gate valve 74, and turbo molecular pump 76 allow accurate and stable control of process chamber pressures from about 1 to 100 millitorr.

The source plasma system 42 includes a top coil 78 and side coil 80, mounted on dome 50. A symmetrical ground shield (not shown) reduces electrical coupling between the coils. Top coil 78 is powered by top RF source generator 82, while the side coil 80 is powered by side RF source generator 84, allowing independent power levels and frequencies of operation for each coil. This dual coil system allows control of the radial ion density in process chamber 38, thereby improving plasma uniformity. Side coil 80 and top coil 78 couple energy into the chamber 38 inductively. In a specific embodiment, the top RF source generator 82 provides up to 8000 W of RF power at nominally 2 MHz and the side RF source generator 84 provides up to 8000 W of RF power at nominally 2 MHz. The operating frequencies of the top and side RF generators may be offset from the nominal operating frequency (e.g., to 1.7-1.9 MHz and 1.9-2.1 MHz, respectively) to improve plasma-generation efficiency.

The RF generators 82 and 84 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 89 and 90 match the output impedance of generators 82 and 84 with coils 78 and 80, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

The bias plasma system 44 includes a RF bias generator 86 and a bias matching network 88. The bias plasma system 44 capacitively couples substrate receiving portion 66 to the body member 62, which act as complementary electrodes. The bias plasma system 44 serves to enhance the transport of plasma species created by the source plasma system 42 to the surface of the substrate. In a specific embodiment, the RF bias generator 86 provides up to 10000 W of RF power at 13.56 MHz.

Other measures may also help stabilize a plasma. For example, the RF control circuit can be used to determine the power delivered to the load (plasma) and may increase or decrease the generator output power to keep the delivered power substantially constant during deposition of a layer.

The gas delivery system 46 includes a plurality of gas sources 100a, 100b, 100c, 100d and 100e. In one embodiment, the aforementioned gas sources comprise of silane, molecular oxygen, helium and argon, respectively. The gas delivery system 46 provides gases from several sources to the process chamber for processing the substrate via gas delivery lines 92 (only some of which are shown). Gases are introduced into the process chamber 38 through a gas ring 94, a top nozzle 96, and a top vent 98. Specifically, gas sources, 100a and 100d, provide gas to top nozzle 96 via flow controllers 120a and 120c, respectively, and gas delivery lines 92. Gas from gas source 100b is provided to gas vent 98 via flow controller 120b. The top nozzle 96 and top vent 98 allow independent control of top and side flows of the gases, which improves film uniformity and allows fine adjustment of the film's deposition and doping parameters. The top vent 98 is an annular opening around the top nozzle 96 through which gas may flow into the process chamber from the gas delivery system.

Gas is provided from each of the aforementioned gas sources to gas ring 94 via flow controller 102a, 102b, 102c, 102d and 102e and gas delivery lines 92. Gas ring 94 has a plurality of gas nozzles 106 and 108 (only two of which is shown) that provide a uniform flow of gas over the substrate. Nozzle length and nozzle angle may be changed by changing gas ring 94. This allows tailoring the uniformity profile and gas utilization efficiency for a particular process within an individual process chamber. In a specific embodiment, the gas ring 94 has a total of thirty-six gas nozzles, twenty-four first gas nozzles 108 and twelve second gas nozzles 106. Typically, gas nozzles 108 (only one of which is shown), are coplanar with, and shorter than, the second gas nozzles 106.

In some embodiments, flammable, toxic, or corrosive gases may be used. In these instances, it may be desirable to eliminate gas remaining in the gas delivery lines after a deposition. This may be accomplished using a three-way valve, such as valve 112, to isolate process chamber 38 from delivery line 92a, and to vent delivery line 92a to vacuum foreline 114, for example. As shown in FIG. 1, other similar valves, such as 112a and 112b, may be incorporated on other gas delivery lines. Such three-way valves may be placed as close to process chamber 38 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

The system 36 may further include a remote cleaning RF plasma source (not shown) for providing a cleaning gas to the top nozzle 96 of the chamber 38. In other embodiments, cleaning gas (if used) may enter the chamber 38 at other locations.

A system controller 132 regulates the operation of system 36 and includes a processor 134 in electrical communication therewith to regulate the operations thereof. Typically, the processor 134 is part of a single-board computer (SBC), that includes analog and digital input/output boards, interface boards and stepper motor controller boards. Various components of the CVD system 36 conform to the Versa Modular European (VME) standard, which defines board, card cage, as well as connector type and dimensions. The VME standard also defines the bus structure as having a 16-bit data bus and a 24-bit address bus. The processor 134 executes system control software, which is a computer program stored in a memory 136, electronically coupled to the processor 134. Any type of memory device may be employed, such as a hard disk drive, a floppy disk drive, a card rack or a combination thereof. The system control software includes sets of instructions that dictate the timing, mixture of gases, process chamber pressure, process chamber temperature, microwave power levels, pedestal position, and other parameters of a particular process Temperature of the substrate 104 and uniformity of the substrate temperature are important processing parameters for processing the substrate 104. To generate a uniform temperature profile, a heat transfer fluid is applied between the chuck 68 and the back surface of the substrate 104. One embodiment of the invention uses, for example, helium as the heat transfer fluid. Generally, the electrostatic chuck 68 is circular in shape, but alternatively, the electrostatic chuck 68 may comprise various regular and irregular geometries to accommodate non-circular substrates, for example, square or rectangular substrate such as flat panels.

In operation, the substrate 104 is placed on the electrostatic chuck 68 and multiple gaseous components are supplied from gas panel 46 into the processing region 52 of the plasma processing chamber 38 to form a gaseous mixture. To ignite a plasma, RF power is applied to one or more of an electrode in the substrate support member 56, the top coil 78, or side coil 80. To maintain temperature uniformity of the substrate during processing, a heat transfer fluid, such as helium gas, is supplied via at least one fluid distribution element (shown and discussed below) in accordance with the embodiments of the present invention.

Figure 2:
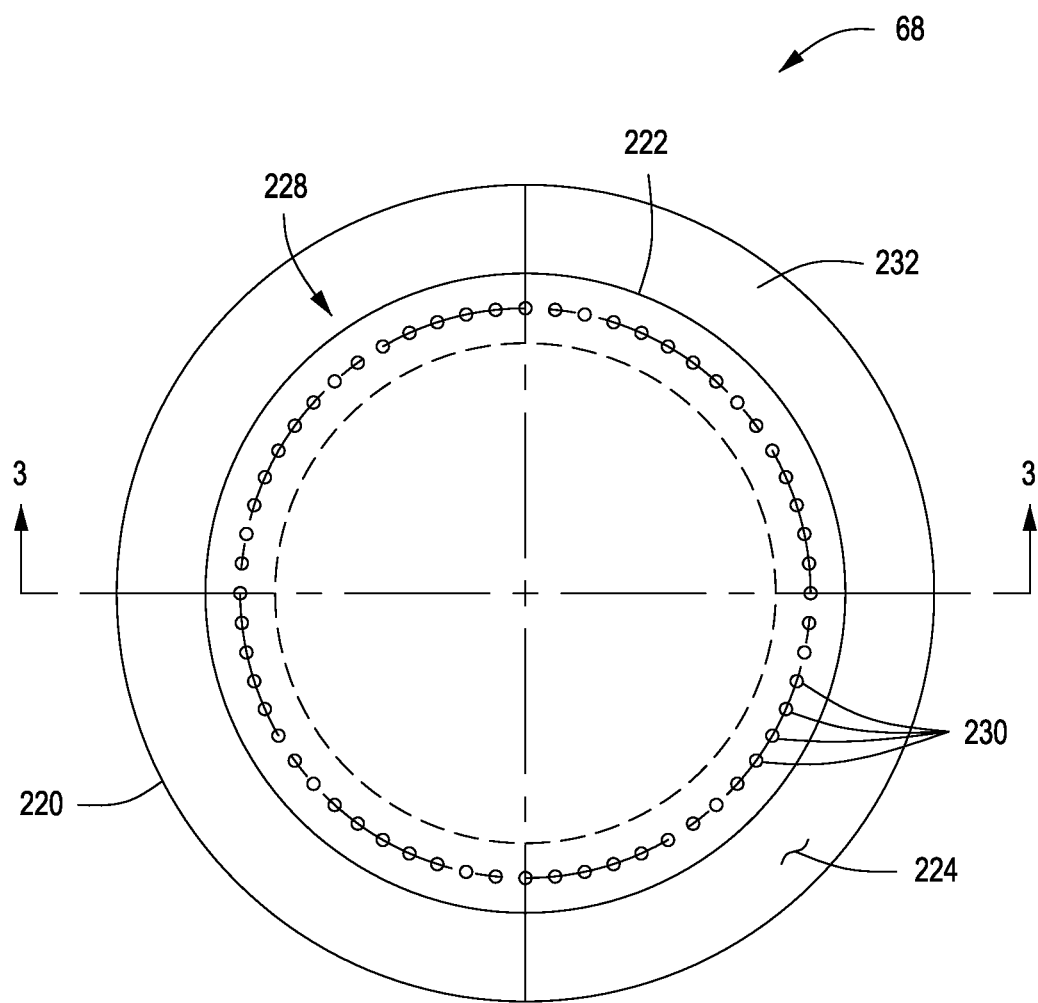
FIG. 2 illustrates a top view of the electrostatic chuck of FIG. 1.
Figure 3:
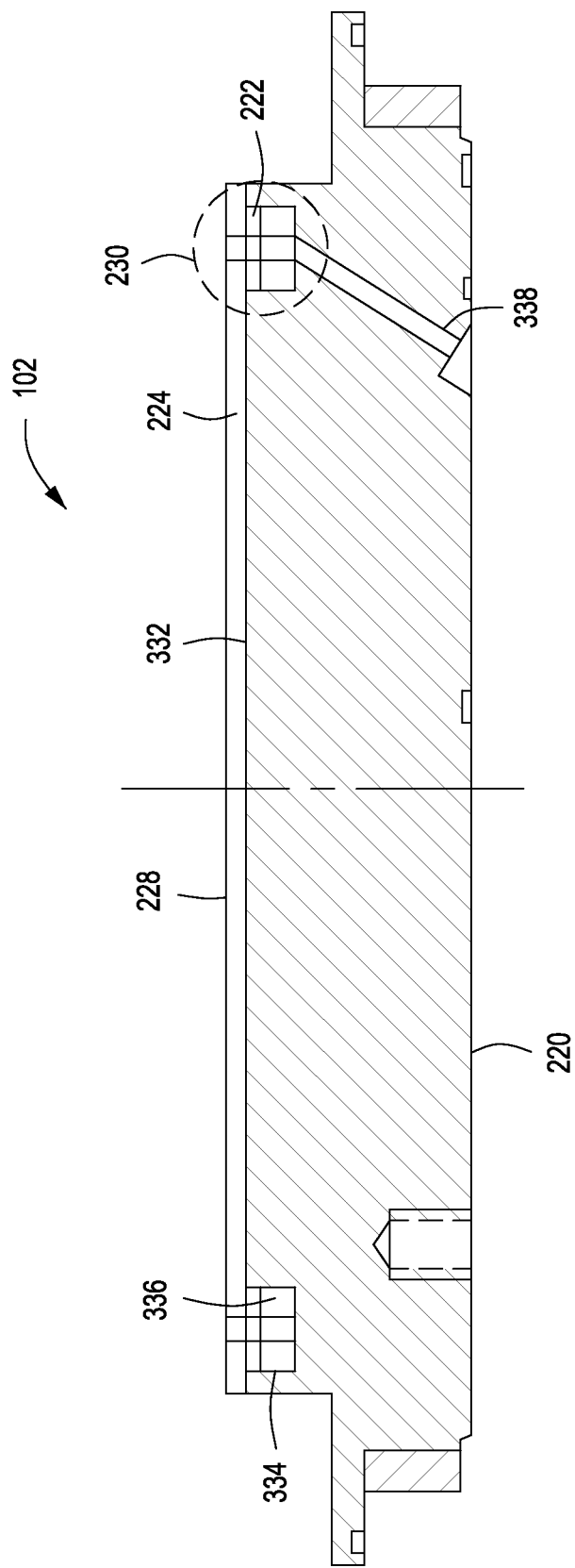
FIG. 3 illustrates a cross-sectional view of the electrostatic chuck of FIG. 2 along the line 3-3.

FIG. 2 illustrates a top plan view of the electrostatic chuck 68 having the fluid distribution element 222 according to one embodiment of the present invention. FIG. 3 depicts a cross-sectional view of the chuck 68 of FIG. 2 taken along line 3-3. The following disclosure is best understood by simultaneously viewing FIGS. 2 and 3. The electrostatic chuck 68 comprises a body 220, a fluid distribution element 222, and a dielectric layer 224. In one embodiment of the electrostatic chuck 68, the body 220 is fabricated of a conductive material such as aluminum and the dielectric layer 224 is a ceramic material such as aluminum-nitride, alumina, and the like. The fluid distribution element 222 is disposed circumferentially near the periphery of the electrostatic chuck 68. The fluid distribution element 222 comprises multiple holes 230 (or other forms of passages) penetrating the dielectric layer 224 for distributing a fluid such as helium gas from the electrostatic chuck to the back surface of the substrate. For the electrostatic chuck 102 used in combination with an 12 inch (300 mm) diameter semiconductor wafer, there are between 60 to 360 holes around the periphery of the electrostatic chuck 102. Each of the multiple holes 230 typically ranges from about 0.15 mm diameter. These dimensions are adjusted depending on the kind of fluid distribution element used, the pressures used within the processing chamber, and the amount of gas flow through the fluid distribution element 222.

The fluid distribution element 222 has a ring-shaped structure. However, in alternate embodiments, the fluid distribution element 222 may have various geometrical designs as per the need of the processing methods and a user including multiple rings, radial arms, combinations of radials and rings, and so on. The embodiments of the invention do not limit the geometry of the fluid distribution element or elements.

The dielectric layer 224 covers at least a portion of the top surface of the body 220 and at least a portion of the fluid distribution element 222 thereby forming a support surface 228. The support surface 228 supports the substrate 104 placed thereon. The dielectric layer 224 may be sprayed onto the top surface of the body and polished to a desired thickness.

The body 220 comprises the top surface 332 and a channel 334 that is formed into top surface 332 of the body 220. Generally, the channel 334 has a rectangular cross-sectional shape. However, in alternate embodiments the channel 334 may have various geometrical cross-sectional shapes. The fluid distribution element 222 is coupled to the body 220 such that the channel 334 and the fluid distribution element 222 form a plenum 336 i.e., the element 222 is positioned into the channel 334 and fixed thereto. Further, the body 220 comprises a conduit 338 connected to the channel 334 for providing fluids to the plenum 336. According to one embodiment of the present invention, the cooling gas may be supplied through the conduit 338 and distributed by the plenum to the fluid distribution element 222. The gas exits through one or more of the multiple holes 230 (or other forms of passages) thereby supplying a heat transfer medium to the back surface of a substrate.

FIGS. 4 to 10 illustrate cross-section views of the dotted line portion 230 of an electrostatic chuck, for example, the electrostatic chuck 102, the portion having a fluid distribution element 222, dielectric layer 228 and the body 220. In the illustrations, the dimensions of the electrostatic chuck have been exaggerated to illustrate the cross-section of the fluid distribution element and the body.

Figure 4:
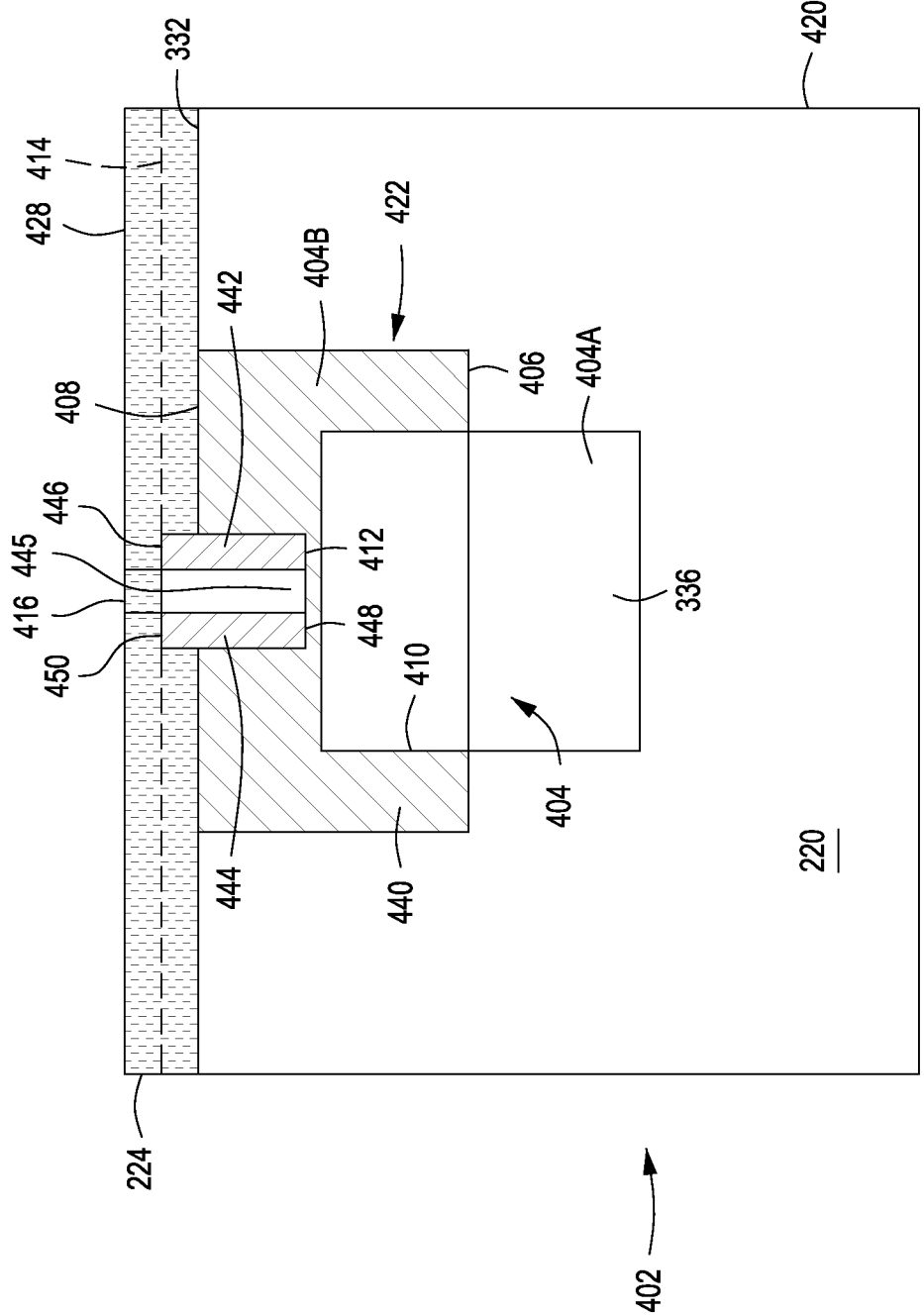
FIG. 4 depicts a cross-sectional view of a fluid distribution element of an electrostatic chuck according to one embodiment of the present invention.

In particular, FIG. 4 illustrates a portion of an electrostatic chuck 402 according to one embodiment of the present invention. The body 220 comprises a dual damascene channel 404 having a lower channel 404A and an upper channel 404B, where the lower channel 404A is narrower than the upper channel 404B. The electrostatic chuck 402 includes a fluid distribution element 422 comprising a plate 440 and a dielectric tube 442. The plate 440 fits into the upper channel 404B (e.g., the plate has a circular plan form to match the channel 404) such that the base 406 of the upper channel 404B forms a stop. The height of the plate 440 is substantially the same as the height of the upper channel 404B such that the top 408 of the plate 440 is substantially coplanar with the top 332 of the body 220. The plate 440 may be fabricated of a conductive material such as aluminum and welded into place in the upper channel 404B. The plate 440 further comprises a channel 410 formed in the bottom surface of the plate 440. In one embodiment of the invention, the width of channel 410 is substantially similar to the width of lower channel 404A; however, in other embodiments, the channel 410 may have a narrower width than lower channel 404A. The combination of the lower channel 404A and the channel 410 defines a plenum 336.

A dielectric tube 442 (an electrical isolator) comprises a first end 446, a second end 448, and an axial through hole 450. The dielectric tube 442, for example, made of alumina, has a diameter substantially matching the diameter of an opening 444 in the plate 440. The diameter of the opening 444 is generally, but not by way of limitation, about 0.008 inches (about 0.2 mm) or larger. In alternate embodiments, the opening 444 may have various geometrical shapes such as circular, rectangular, square, and the like. Moreover, the shape and size of the opening substantially matches to the shape and size of an outer diameter of the dielectric tube 442. The dielectric tube 442 is positioned (e.g., press fit) into the opening 444. The opening 444 comprises a flange 412 upon which the tube 442 rests (i.e., the flange forms a stop). In the depicted embodiment, the first end 446 of the tube 442 extends above the surface 332 of the body 220. In other embodiments, the first end 446 of the tube 442 may be coplanar with the surface 332.

At least a portion of the body 220 and at least a portion of the fluid distribution element 422 are covered by the dielectric layer 224 thereby forming the support surface 428. The dielectric layer 224 may be sprayed onto the top surface of the body and polished to a desired thickness. In one embodiment, the dielectric layer 224 comprises thermally sprayed Alumina or sprayed Alumina/Titania. Processes for application of this thermally sprayed dielectric layer are known in the art. The thermal spraying process can be selected from several different methods such as plasma spraying, detonation gun spraying, high velocity oxygen fuel (HVOF) spraying and flame spraying.

In one embodiment, the dielectric layer 224 is polished to a thickness represented by line 414 such that the surface 428 of the layer 224 is coplanar with the end 446 of the tube 442. Alternatively, the dielectric layer 224 may be a porous ceramic such that the layer 224 is polished to a specific flatness, but the layer 224 covers at least the first end 446 of the tube 442. Due to the porosity of the ceramic, gas from the plenum flows through the tube 442 and the dielectric layer 224. For example, the dielectric layer 224 proximate the first end 446 of the tube 442 may be wholly or partially formed of alumina with a porosity of between 10 and 60 percent by volume that results in pore diameters of about 1 to 100 um. In some embodiments, as discussed below with respect to FIG. 8, the dielectric layer may be porous proximate the end 446 of the tube 442, and less porous elsewhere. As illustrated, the passage 445 advantageously lacks a direct line-of-sight path from the support surface 428 to the plenum 436 thereby limiting the potential for formation of a plasma in the passage 445. In another embodiment, the dielectric layer 224 is polished to a specific flatness with the layer 224 covering the first end 446 of the tube 442. A hole 416 can be bored or otherwise formed (e.g., laser drilling) through the dielectric layer 416 into the passage 445. The boring process only bores through the dielectric material, i.e., the conductive material of the body is not sputtered by the boring process.

As known in the art, the support surface 428 may further be processed to provide a pattern of grooves (not shown in the figure) made onto the dielectric layer 224. The grooves are machined or otherwise formed into the support surface 428 so that they intersect with the passage 445. The cooling gas can proceed from passage 445 and into the grooves for distributing the cooling gas uniformly over the entire support surface 428 of electrostatic chuck 402.

By using an electrical isolator (the dielectric tube and/or the dielectric layer) to define the passage between the plenum and the substrate surface, the possibility for plasma formation from the heat transfer gas or arcing caused by plasma formation is reduced. By reducing or eliminating plasma formation and arcing, the life of an electrostatic chuck is significantly increased. The use of an isolator, reduces the electric fields in the passage; thus, reducing the chance for plasma formation. In addition, certain embodiments of the invention utilize a fluid distribution element structure that further reduces the electric fields in the passage by eliminating a line of sight path between the substrate support surface (where high electric fields exist) and the conductive surface of a plenum. When such a line-of-sight path exists, the volume of fluid in the passage is sufficient to be ignited into a plasma. Using a non-line-of-sight path reduces the electric fields that are established across sufficiently large volumes of fluid that might result in plasma formation. As such, plasma formation and associated arcing are reduced or eliminated.

Figure 5:
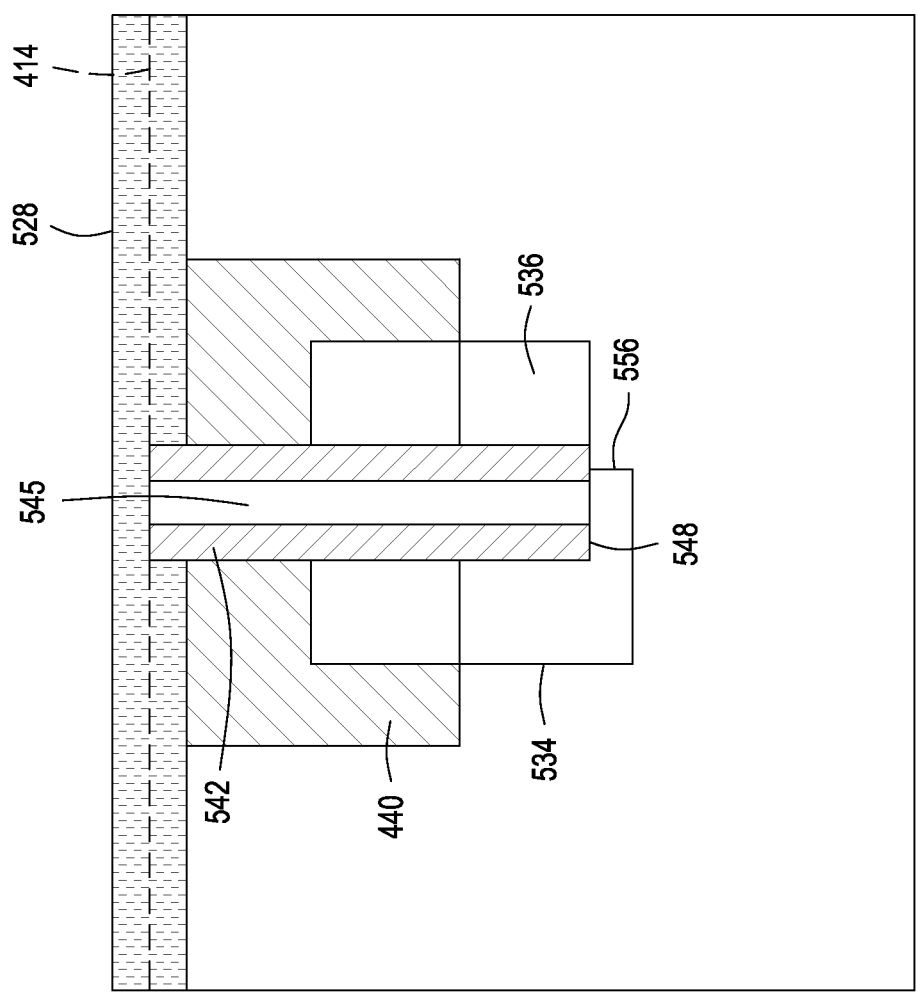
FIG. 5 depicts a cross-sectional view of a fluid distribution element of an electrostatic chuck according to another embodiment.

FIG. 5 illustrates a cross-section of a portion an electrostatic chuck 502 according to another embodiment of the present invention. Similar to the embodiment of FIG. 4, a dielectric tube 542 is positioned through the plate 440. In this alternative embodiment, the tube 542 extends to the bottom of the channel 534 where a second end 548 of the tube 542 rests upon a supporting element (e.g., a step 556) formed in the bottom of the channel 534. As in the previous embodiment, the dielectric tube 542 and/or the portion of dielectric layer 224 forms an electrical isolator that defines a passage 545 for the fluid from a plenum 536 to the surface 528.

Figure 6:
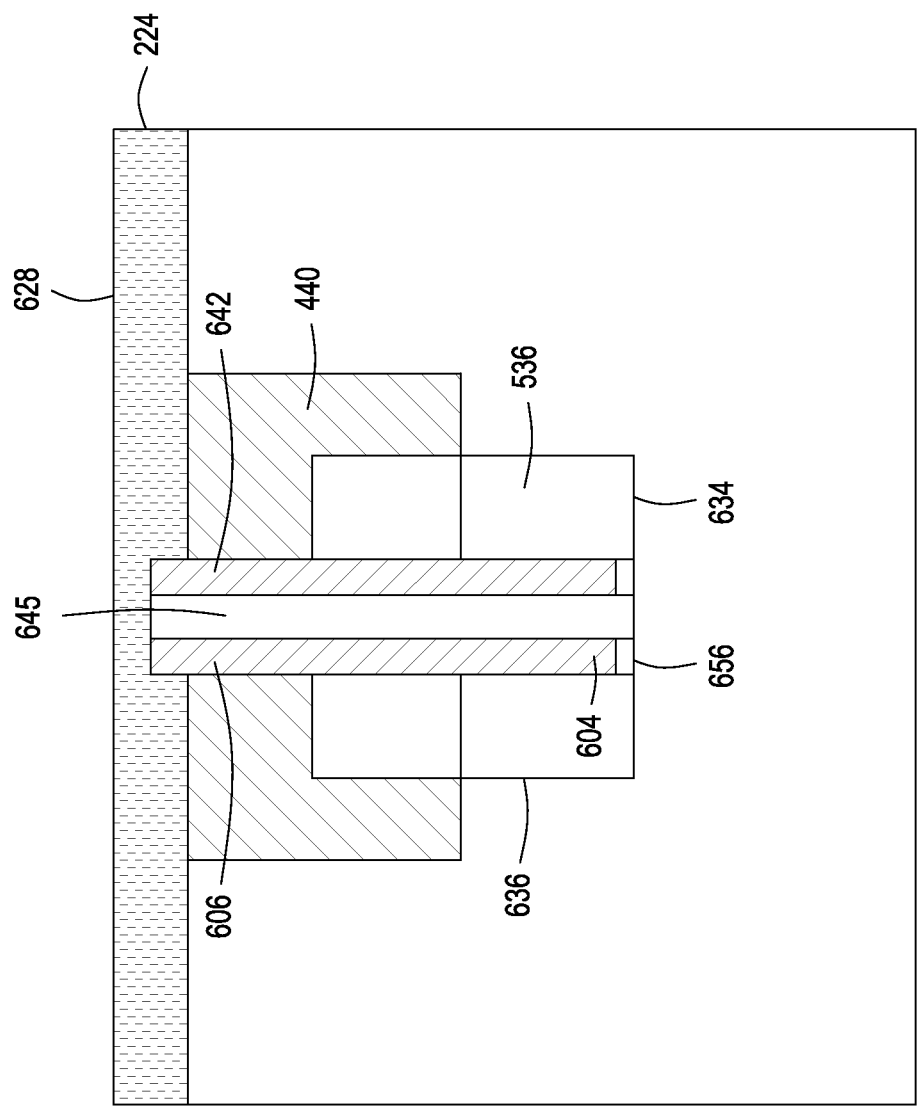
FIG. 6 depicts a cross-sectional view of a fluid distribution element for an electrostatic chuck according to another embodiment.

FIG. 6 illustrates a cross-section of a portion the electrostatic chuck 602 according to another embodiment of the present invention. Similar to the embodiments of FIGS. 4 and 5, a dielectric tube 642 is positioned through the plate 440. In this alternative embodiment, the dielectric tube 642 comprises at least one notch 656 formed in the second end 604. In an alternative embodiment, the tube 642 may comprise holes to facilitate fluid flow from the plenum 636 to a passage 645 in the tube 642. As with prior embodiments, the dielectric layer 224 may be porous and cover a first end 606 of the tube 642, the layer 224 may be polished to expose the first end 606 of tube 642, or a hole formed in the layer to access the passage 645. The dielectric tube 642 and the portion of dielectric layer 224 forms a passage 645 for the fluid from a plenum 636. As illustrated, when the dielectric layer 224 is porous and covers the tube 642, the passage 645 advantageously lacks a direct line-of-sight path from the support surface 628 to the plenum 636 thereby limiting formation of a plasma in the passage 645.

Figure 7:
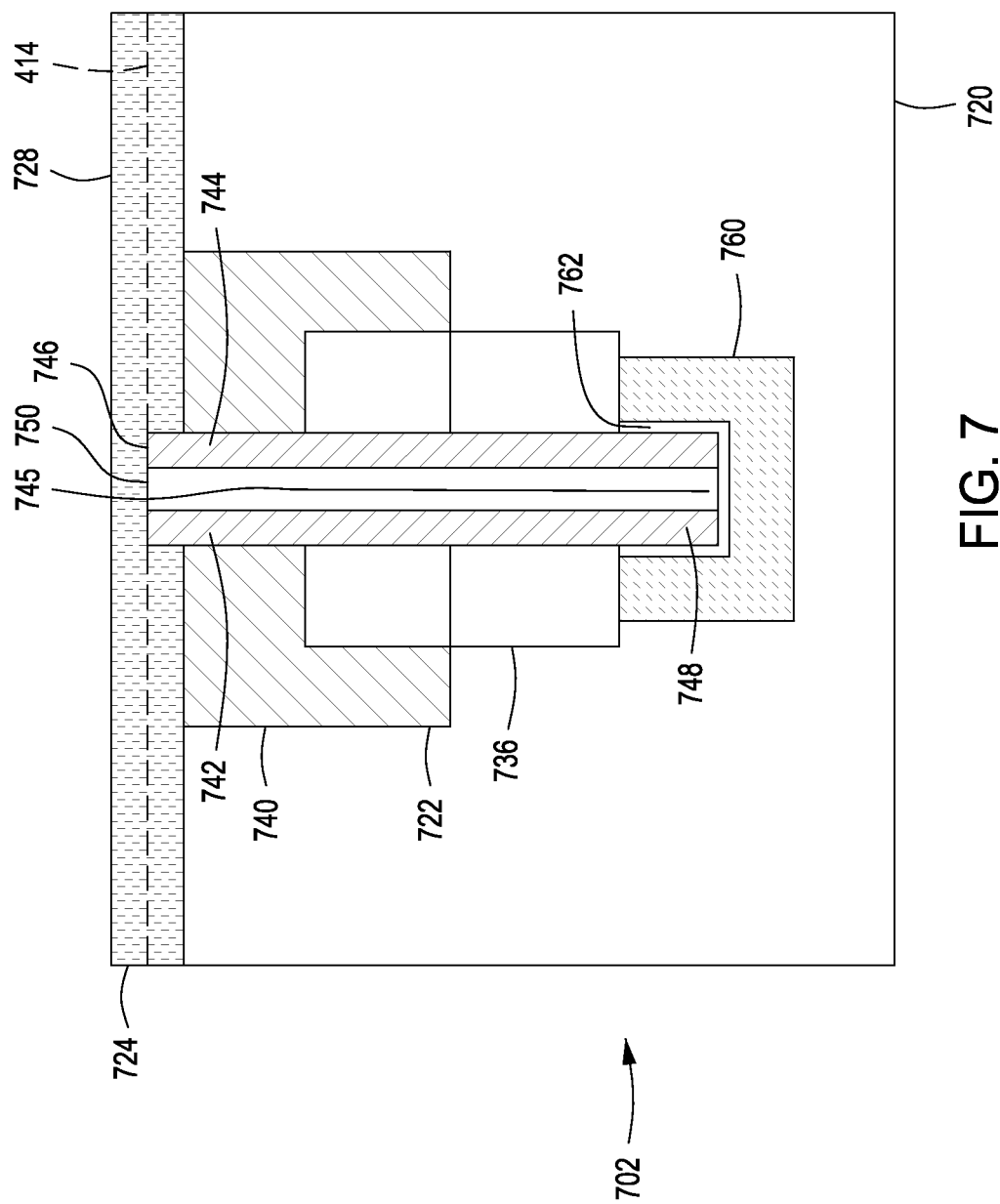
FIG. 7 depicts a cross-sectional view of a fluid distribution element of an electrostatic chuck according to yet another embodiment of the present invention.

FIG. 7 illustrates a cross-section of a portion of an electrostatic chuck 702 according to yet another embodiment of the present invention. The electrostatic chuck 702 comprises a body 720 and fluid distribution element 722. The fluid distribution element 722 comprises a plate 740 and a dielectric tube 742 that are assembled in the same manner as the previous embodiments. In this embodiment, the body 720 comprises a channel 734 comprising a dielectric end cap 760. The dielectric end cap 760 is positioned at the bottom of the channel 734. The dielectric end cap 760 comprises an opening 762 such that the cap 760 is cup shaped. The dielectric tube 742 comprises a first end 746, a second end 748, and an axial through hole 750 connecting the first end 746 and the second end 748. In one embodiment of the invention, the dielectric layer 724 covers the first end 746 of the tube 742 and, in a second embodiment, the dielectric layer 724 is polished to line 414 to expose the first end 746 of the tube 742. The dielectric cap 760 is positioned into the channel 734 such that the second end 748 of the tube 742 extends into the opening 762, but is spaced apart therefrom to form a gap. The tube 742 and the end cap 760 form a labyrinth channel through which the fluid flows. Using such a channel ensures that a line-of-sight path from the conductive plenum walls to the chuck surface does not exist.

Figure 8:
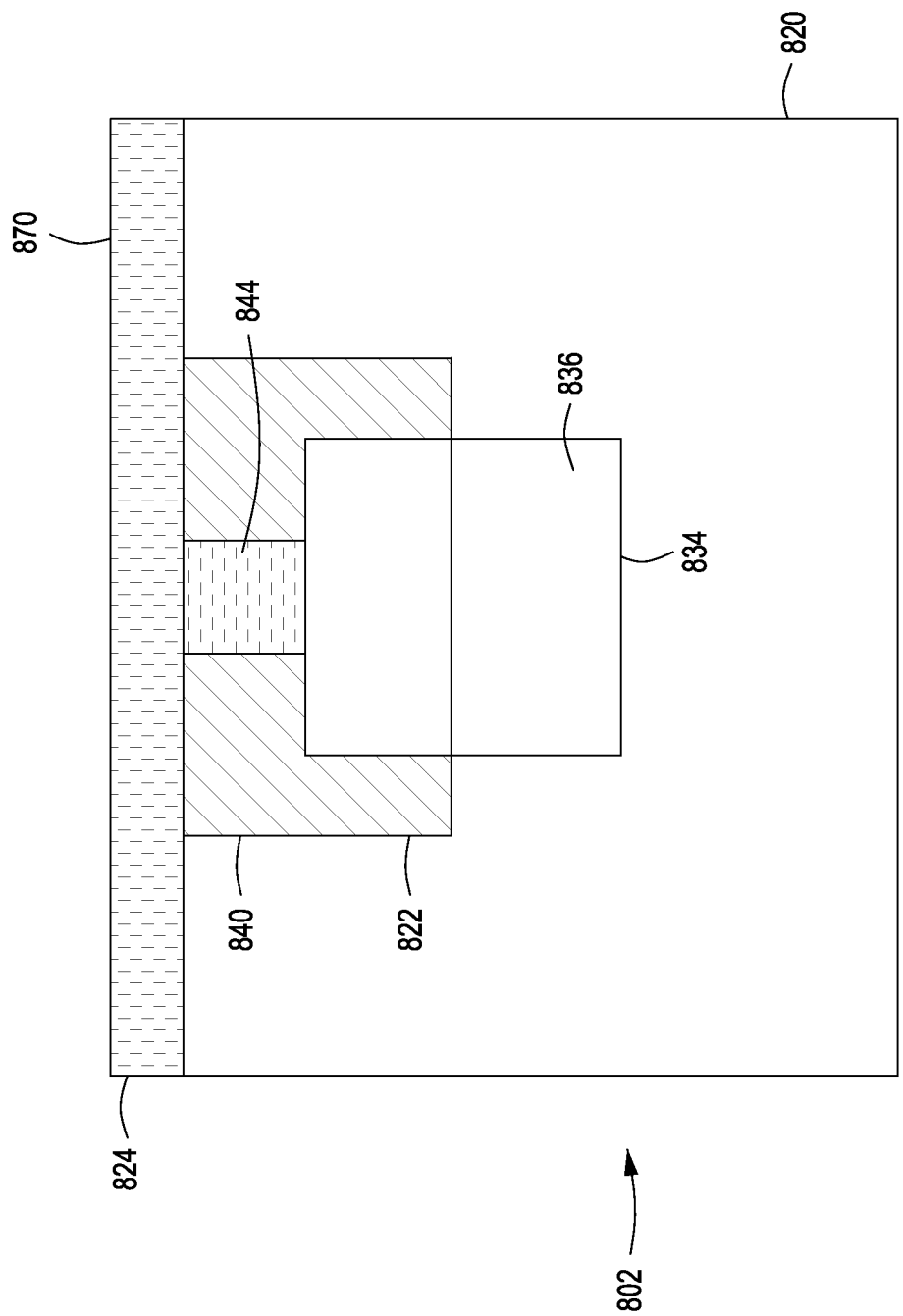
FIG. 8 depicts a cross-sectional view of a fluid distribution element of an electrostatic chuck according to various embodiments of the present invention.

FIG. 8 illustrates a cross-section of a portion an electrostatic chuck 802 according to another embodiment of the present invention. The electrostatic chuck 802 comprises a fluid distribution element 822. The fluid distribution element 822 comprises a plate 840 comprising an opening 844. The plate 840 is coupled to a body 820 such that a channel 834 and the plate 840 form a plenum 836. A dielectric layer 824 covers at least a portion of the body 820 and at least a portion of the fluid distribution element 822. The dielectric layer 824 comprises a porous dielectric segment 870 such that at least a portion of the porous dielectric segment 870 overlaps the opening 844. The porous dielectric segment 870 is a porous ceramic, such as alumina having a porosity ranging from about 10% in volume to about 60% in volume, with interconnected openings that form continuous passageways through the porous dielectric segment 870. The opening 844 and at least a portion of the porous dielectric segment 870 form a passage 845 for the fluid to flow from the plenum 836 to the support surface 828 of the electrostatic chuck 802. As illustrated, the passage 845 advantageously lacks direct line-of-sight path from the support surface 828 to the conductive plenum 836 thereby inhibiting formation of a plasma into the passage 845.

Figure 9:
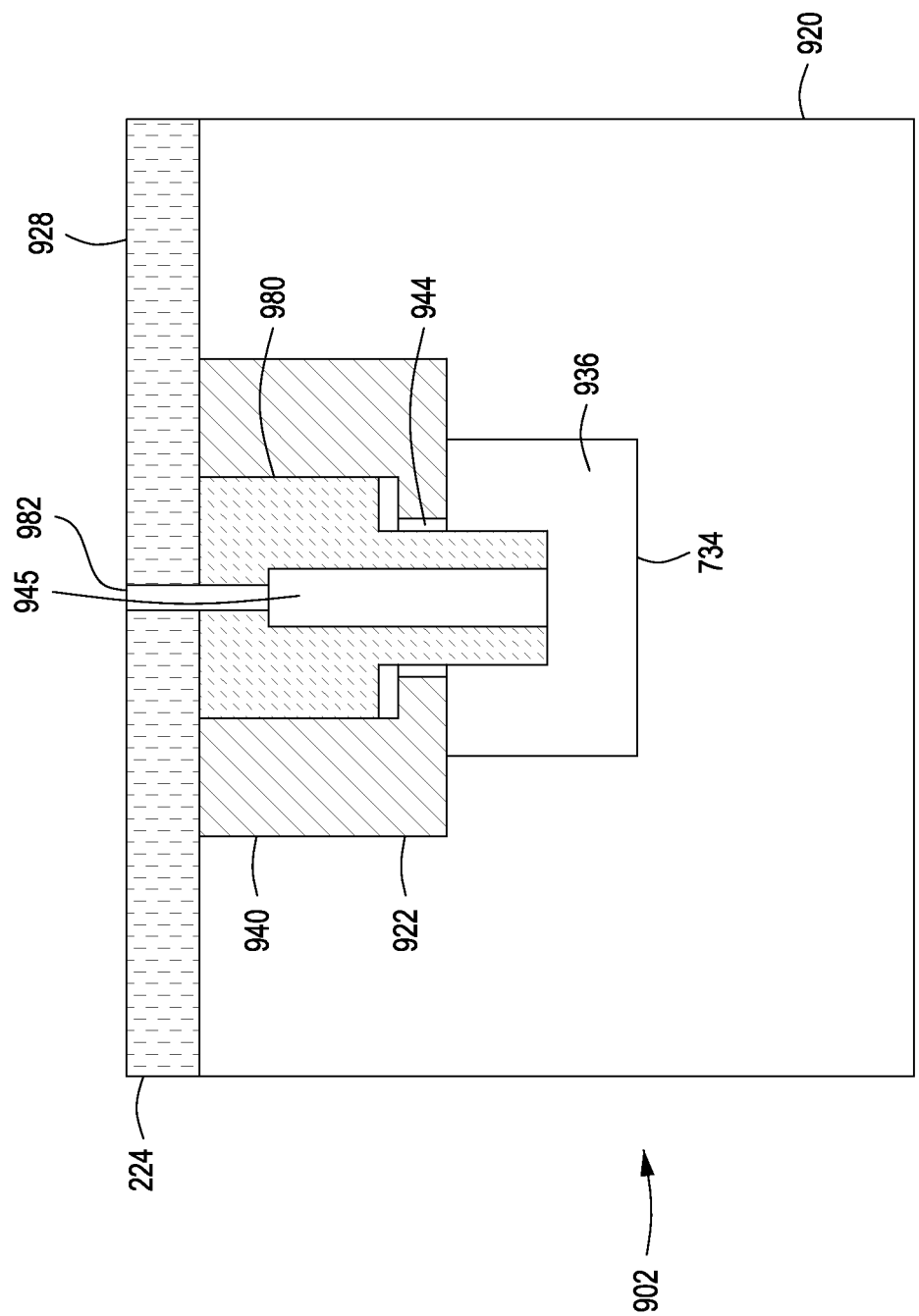
FIG. 9 depicts a cross-sectional view of a fluid distribution element of an electrostatic chuck according to various embodiments of the present invention.

FIG. 9 illustrates a cross-section of a portion an electrostatic chuck 902 according to another embodiment of the present invention. The electrostatic chuck 902 comprises a fluid distribution element 922. The fluid distribution element 922 comprises a plate 940 having an opening 944 and a dielectric plug 980. The plate 940 is coupled to a body 920 such that a channel 934 and the plate 940 form a plenum 936. The plate 940 and body 920 are assembled as discussed above with respect to the other embodiments of the invention. Diameter of the dielectric plug 980 substantially matches with the diameter of the opening 944. The dielectric plug 980 is positioned in the opening 1044 and generally press fit therein. The dielectric layer 224 covers at least a portion of the body 920 and at least a portion of the fluid distribution element 922 thereby forming a support surface 928. The dielectric layer 224 may be sprayed onto the top surface of the body 920 and the fluid distribution element 922, and polished to a desired thickness. A hole 982 is formed through the dielectric layer 224 and through the dielectric plug 980. The hole 982 enables flow of the fluid from the plenum 936 to the support surface 928 of the electrostatic chuck 902. The hole 982 may be formed using various techniques such as mechanical drilling, laser drilling and the like. The hole 982 is formed through only dielectric material. As such, no metallic residue from the drilling process can form on the axial through hole 982. Without such metallic residue, the possibility of plasma formation or arcing in the hold 982 is limited.

Figure 10:
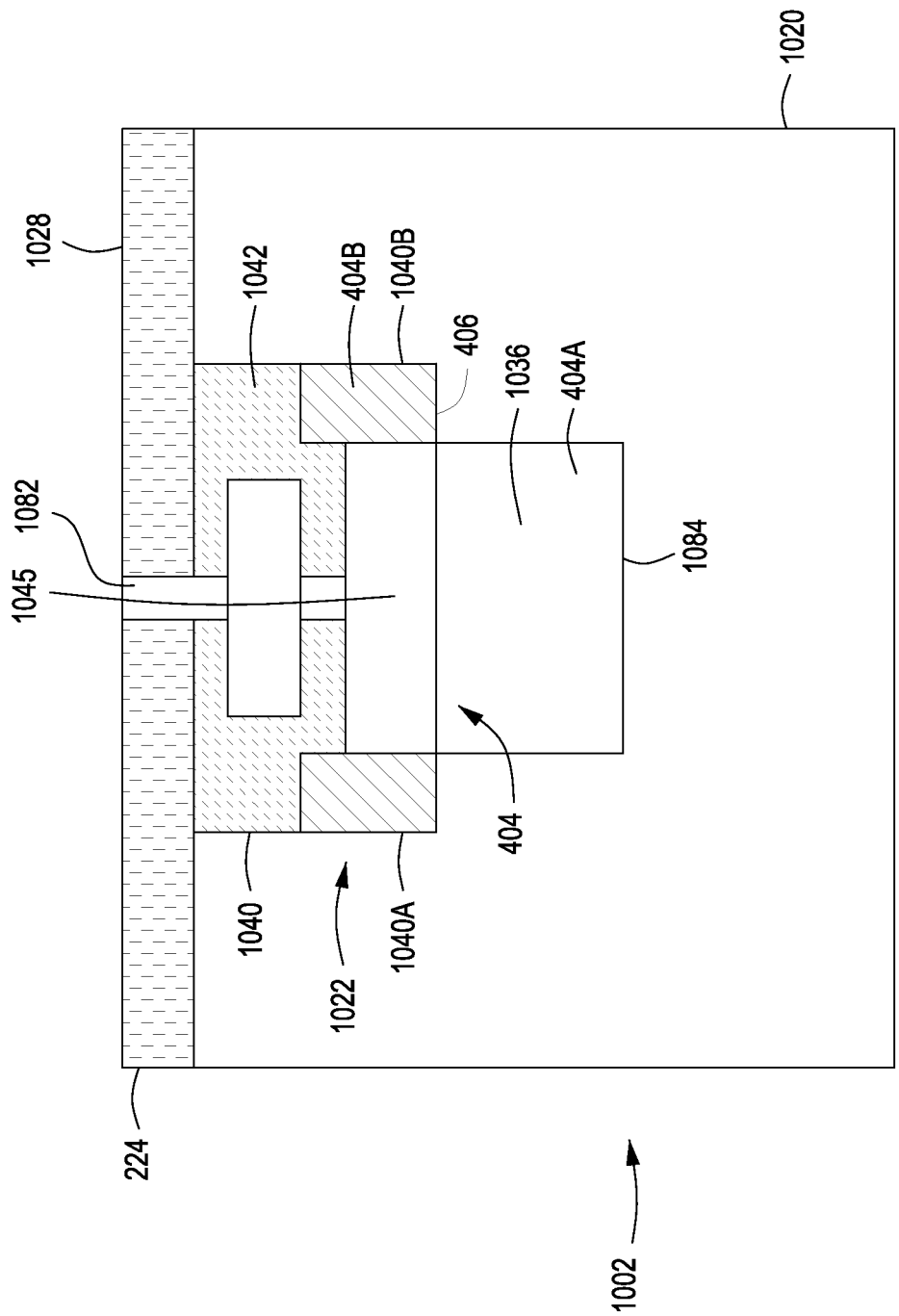
FIG. 10 depicts a cross-sectional view of a fluid distribution element of an electrostatic chuck according to various embodiments of the present invention.

FIG. 10 illustrates a cross-section of a portion an electrostatic chuck 1002 according to another embodiment of the present invention. The electrostatic chuck 1002 comprises a fluid distribution element 1022. The fluid distribution element 1022 comprises a plate 1040 and a dielectric cap 1042. The plate 1040 comprises two circular rings 1040A and 1040B. The ring 1040A has a smaller diameter than ring 1040B. Each ring 1040A and 1040B rests upon the ledge 406 formed at the bottom of the upper channel 404B. The plate 1040 is welded to the body 1020 to retain the plate in the upper channel 404B. The dielectric cap 1042 (ring shaped to form the plenum 1036) is inserted into the upper channel 404B and rests upon the plate 1040.

In another embodiment, the plate 1040 may comprise an inverted U-shaped cross-section (e.g., the plate 440 of FIG. 4) having a plurality of counter-sunk holes. A circular (donut-shaped) dielectric element having a cross-section similar to the element 1042 may be inserted into such a counter-sunk hole. The fluid distribution element 1022 is coupled to a body 1020 such that the fluid distribution element 1022 and a channel 1034 form a plenum 1036. The dielectric layer 224 covers at least a portion of the body 1020 and at least a portion of the fluid distribution element 1022, thereby forming a support surface 1028. The dielectric layer 224 may be sprayed onto the top surface of the body 1020 and the fluid distribution element 1022 and polished to a desired thickness. A hole 1082 is formed through the dielectric layer 224 and the dielectric cap 1090. The hole 1082 may be drilled using various techniques such as mechanical drilling, laser drilling and the like. As with the embodiment of FIG. 9, the hole 1082 is formed through dielectric material only. As such, no conductive residue remains in the hole 1082.

In each of the foregoing embodiments, in the unlikely occurrence that an electrostatic chuck utilizing the inventive fluid distribution element(s) is damaged by plasma formation or arcing, the chuck can be easily repaired (or refurbished) using a number of methods. Generally, a damaging plasma formation or arcing will occur proximate or within a dielectric component (tube, porous insert, and the like). As such, the dielectric layer can be removed locally (over the dielectric component) or globally (across the entire chuck) to expose the dielectric component. The component can then be removed using an extraction tool to drill out or pull out the component. Once removed, a new dielectric component can be inserted and the dielectric layer replaced either locally or globally as needed. In some embodiments, the dielectric component may extend to the support surface of the chuck (as discussed above) and not require removal of the dielectric layer before extraction. In those situation, the damaged dielectric component is removed and a new dielectric component is inserted (generally press fit) into the opening in the plate. In this manner, an electrostatic chuck can be repaired at substantial savings when compared to replacing an entire electrostatic chuck upon arcing or plasma formation in or near the heat transfer fluid passages.

Figure 11:
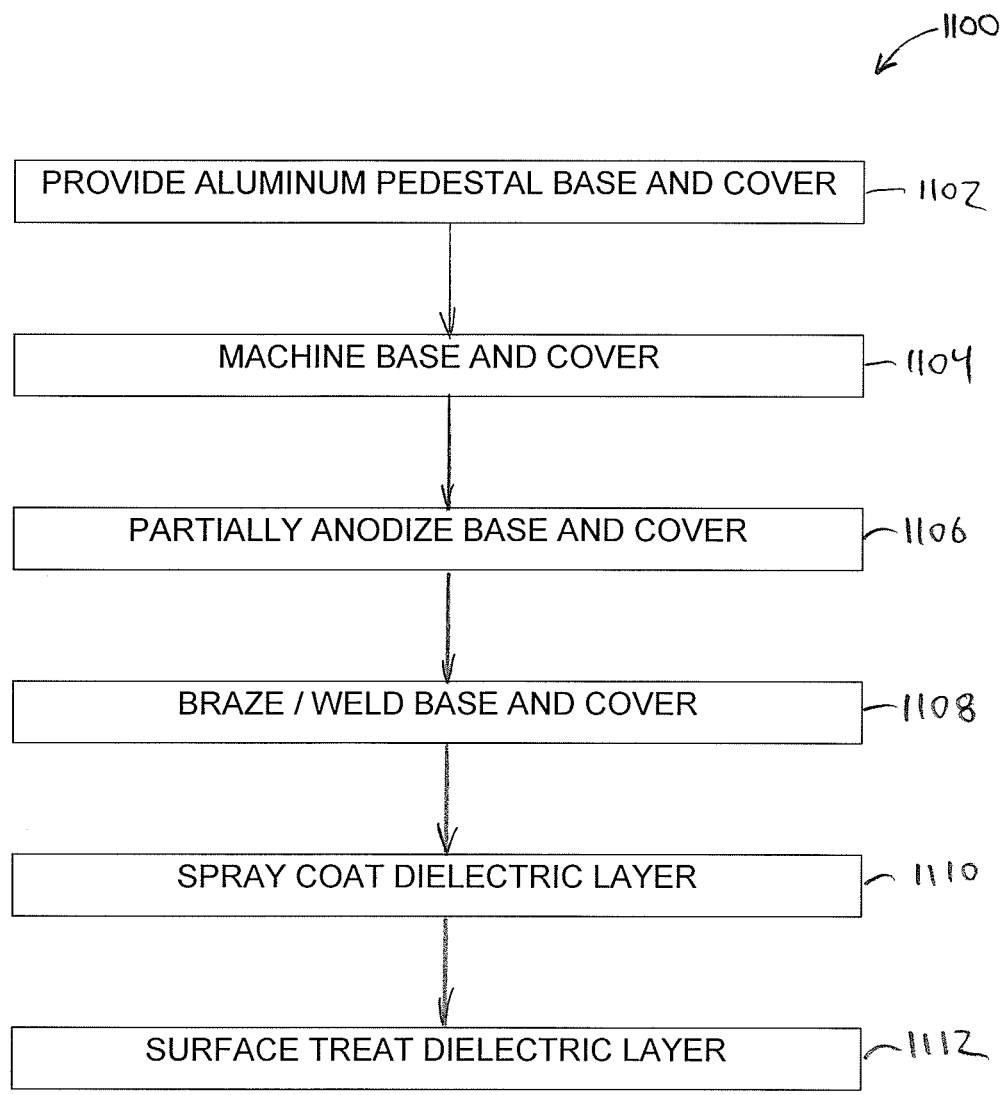
FIG. 11 depicts a method of manufacturing an electrostatic chuck in accordance with some embodiments of the invention.

FIGS. 11-19 depict modifications and/or alternatives of the above embodiments that provide for reduction in the incidence or likelihood of arcing. In each of the following embodiments, like materials may be used as discussed above for the various components. FIG. 11 depicts a method of manufacturing an electrostatic chuck in accordance with some embodiments of the present invention. Generally, a conductive body (e.g., an aluminum base) of a electrostatic chuck and a plate (e.g., a cover) are provided at 1102. At 1104, the body and the plate may be machined or drilled to form one or more fluid passages in the plate, one or more channels in the body, and one or more lift pins holes through the body.

At 1106, the portions of the body and the plate can be anodized to form an electrically insulated region. For example, interior surfaces of the fluid passages, and surfaces which form a fluid plenum (e.g., the channels in the body and a portion of a lower surface of the plate disposed over the channels when the plate is positioned with respect to the body), can be electrically insulated by anodizing the exposed aluminum surface of the fluid passages, lift pin holes and plenums. Alternatively, other insulation treatments may be applied as discussed above, or the anodizing treatment may be combined with other insulation treatments as discussed below in FIGS. 15-16.

At 1108, upon completion of the insulation treatment, the plate may be brazed or welded to the body to attach the plate to a surface of the channel and/or to couple the ESC to, for example, a substrate support. At 1110, a dielectric layer may be disposed atop an upper surface of the body and the plate and/or atop any exposed conductive surface of the electrostatic chuck. The dielectric layer may be deposited via a spray coating method, for example, a plasma spray coating method.

At 1112, the surface of the dielectric layer may further be treated to prepare the surface for use in supporting a substrate. For example, and as discussed in more detail below, the dielectric layer may be ground or polished to reduce surface roughness. Further, the surface may be treated by bead blasting or other methods to form raised features (e.g., dimples) in the surface of the dielectric layer that provide a reduced contact area between the dielectric layer and a substrate disposed thereon. The embossed features may be utilized to provide one or more of uniform chucking, temperature, reduced substrate contamination, or the like. The embossed features may further have a cross section in a plane parallel to a substrate support surface having a smoothly varying peripheral edge. For example, the cross section may be circular, oval, or other such shape having a smoothly varying peripheral edge that facilitates prevention of chipping, flaking, or breaking off of portions of the dielectric layer.

Figure 12:
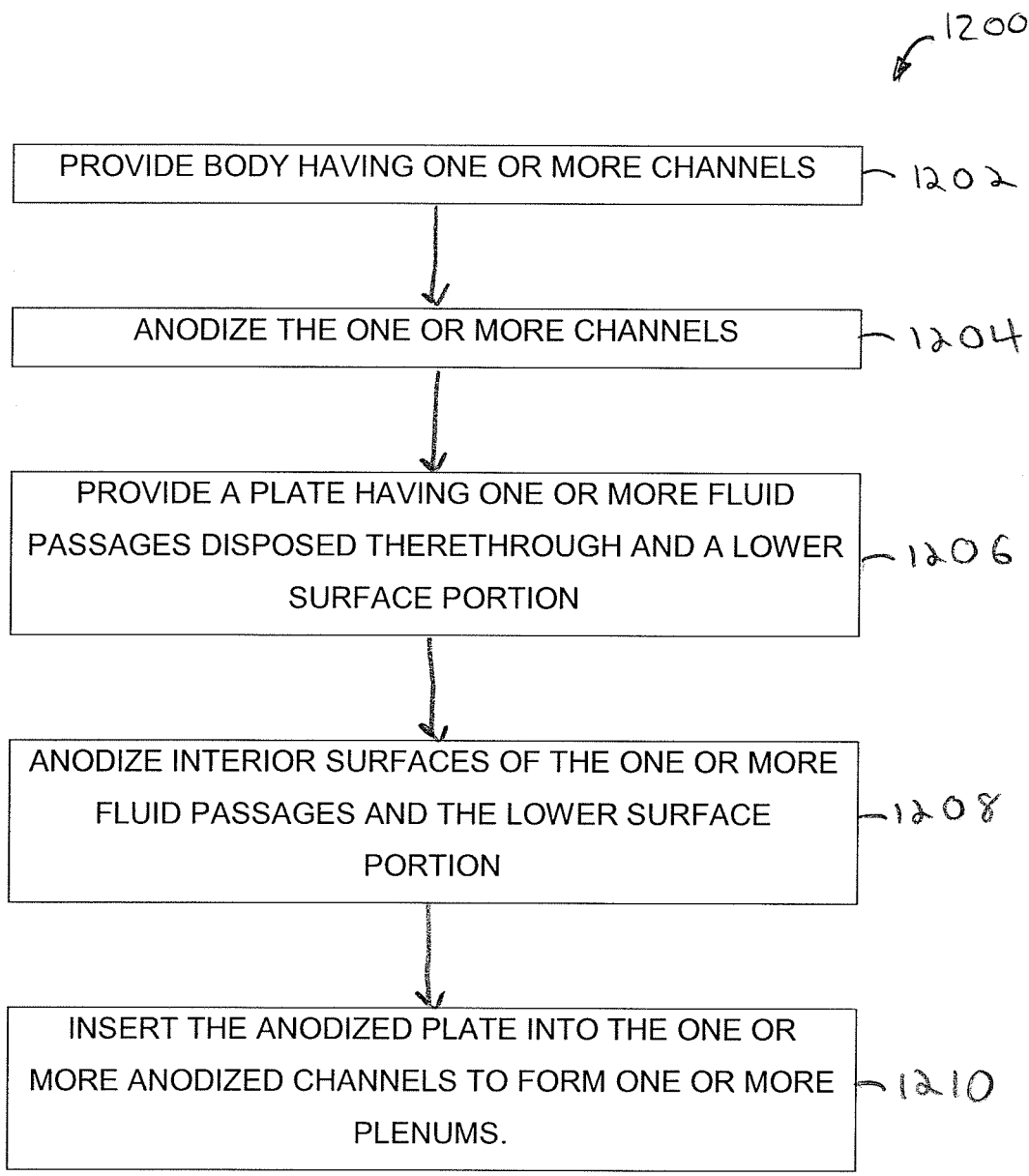
FIG. 12 depicts a method of manufacturing an electrostatic chuck in accordance with some embodiments of the invention.

FIG. 12 depicts a method of manufacturing an electrostatic chuck in accordance with some embodiments of the present invention. The method 1200 depicted in FIG. 12 is described below with respect to FIG. 14. The method 1220 begins by providing a body having one or more channels disposed therein. One exemplary body is a body 1400 having an inner channel 1402 and an outer channel 1404. The body 1400 may comprise a conductive material, such as aluminum or the like. The inner and outer channels may be machined by any suitable means.

Figure 14:
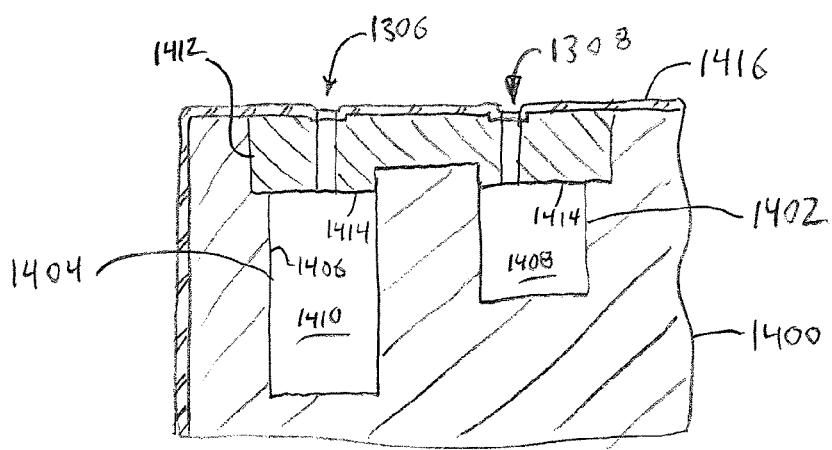
FIG. 14 depicts a partial cross-sectional view of an electrostatic chuck in accordance with some embodiments of the invention.

At 1204, the one or more channels of the body are anodized, for example, to insulate surfaces of the one or more channels and/or to form an anodized layer, such as an oxide layer on inner surfaces 1406 of the one or more channels. The body 1400 may be masked such that other surfaces of the body proximate the one or more channels are not be anodized. For example, in some embodiments, portions of the body and channels may be masked by any suitable means such that only the surfaces of the one or more channels may be exposed to the anodizing environment. As illustrated in FIG. 14, the surfaces of the inner and outer channels which form surfaces of one or more plenums (e.g., an inner plenum 1408 and an outer plenum 1410) are anodized.

At 1206, a plate having one or more fluid passages disposed therethrough and having a lower surface portion is provided. For example, the plate 1412 may have one or more fluid passages, such as an inner fluid passage 1308 and an outer fluid passage 1306 disposed therethrough. Further, the plate 1412 may have a lower surface portion 1414, where the lower surface portion forms a surface of the inner and outer plenums 1408, 1410. The plate 1412 may be formed of a conductive material including aluminum or the like.

Figure 15:
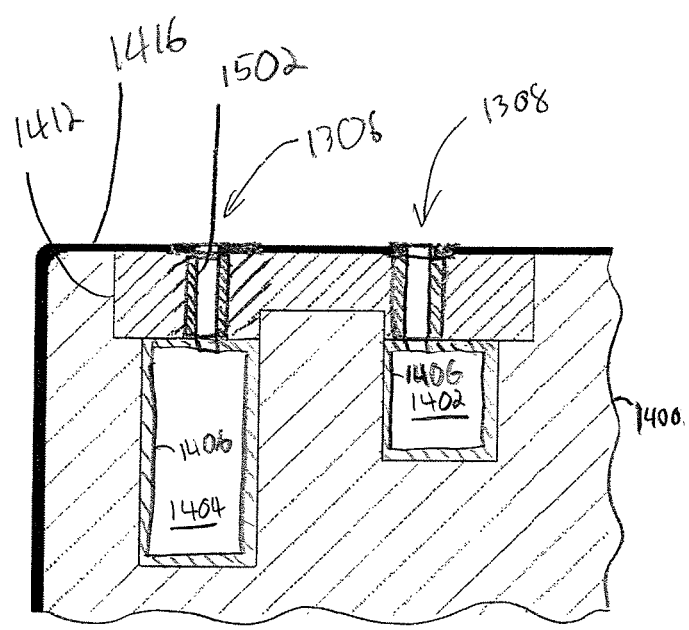
FIG. 15 depicts a partial cross-sectional view of an electrostatic chuck in accordance with some embodiments of the invention.
Figure 16:
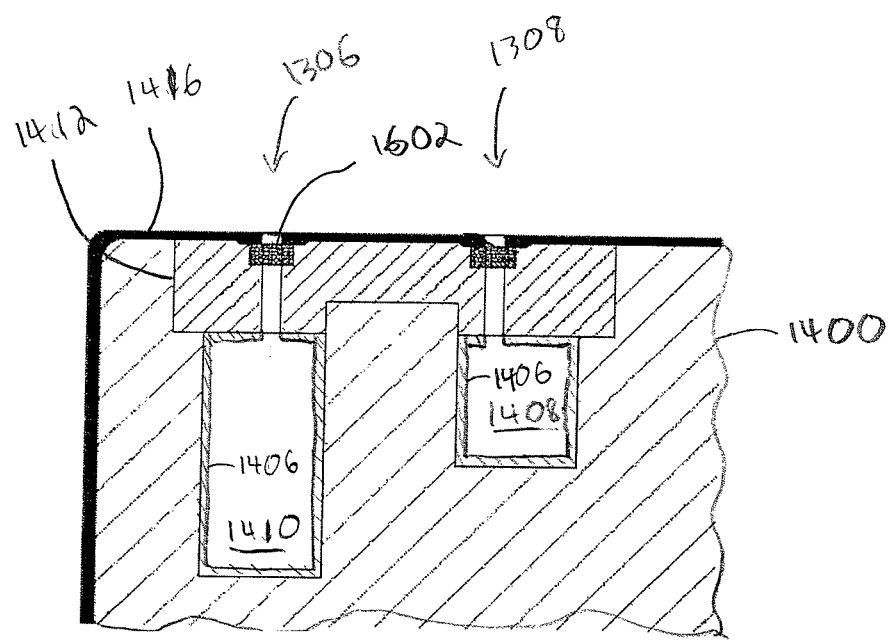
FIG. 16 depicts a partial cross-sectional view of an electrostatic chuck in accordance with some embodiments of the invention.

At 1208, the interior surfaces of the one or more fluid passages and the lower surface portions of the plate 1412 are anodized. The anodizing may form an anodized layer, such as the oxide layer 1406 on the surfaces of each fluid passage 1306, 1308 and on the lower surface portion 1414 of the plate 1412. In some embodiments, other surfaces of the plate, for example, those surfaces of the plate 1412 contacted by corresponding surfaces of the one or more channels are not anodized. However, in some embodiments, the entire outer surface, or those surfaces of the plate contacting corresponding surfaces of the one or more channel, may be anodized. Alternatively or in combination, as depicted in FIG. 15, a dielectric tube 1502 (e.g., a bushing) may be inserted into each fluid passage of the plate 1412, or a porous dielectric insert 1602 may be inserted into each fluid passage, as depicted in FIG. 16. The dielectric tube 1502 and/or porous dielectric insert 1602 may be used in place of anodizing each fluid passage or in combination with anodizing each fluid passage of the plate 1412.

At 1210, the anodized plate 1412 is inserted into the one or more anodized channels 1402, 1404 to form the one or more plenums 1408, 1410. In some embodiments, and as depicted in FIG. 14, the inner plenum 1408 is fluidly coupled to the inner fluid passage 1308, and the outer plenum 1410 is fluidly coupled to the outer fluid passage 1306. In some embodiments, the plate 1412 may be brazed or welded to surfaces of the one or more channels contacted by the anodized plate 1412. As discussed above, in some embodiments, only surfaces of the one or more channels and the lower surface portion of the plate forming the one or more plenums are anodized. Other surfaces, such as the surfaces of the plate and the corresponding surfaces of the body contacted by those surfaces of the plate are not anodized. For example, such surfaces may not be anodized to better allow for brazing or welding of the surfaces of the plate to surfaces of the channel.

With the insertion of the plate 1412 into the one or more channels of the body 1400, the method 1200 generally ends. However, further method steps may be performed, such as the deposition of a dielectric layer 1416 atop the body 1400 and the plate 1412 and along the sidewalls of the body 1400. For example, the dielectric layer may cover at least a portion of the plate 1412 and at least a portion of the body 1400 to form a support surface for a substrate to be disposed thereon. In some embodiments (not shown), the dielectric layer 1416 may be sufficiently porous such that it may cover the plate 1412 including the fluid passages 1306, 1308. Alternatively, in embodiments where the dielectric layer 1416 is not sufficiently porous and/or where it is not desired to cover the fluid passages 1306, 1308 with the dielectric layer 1416, a gas may be flowed from the fluid passages 1306, 1308 during deposition of the dielectric layer 1416 to prevent the deposition of the dielectric layer in and/or over the fluid passages 1306, 1308. After deposition, the dielectric layer 1416 may be further treated to form embossed features discussed above. The dielectric layer 1416 may comprise a dielectric material such as aluminum oxide ($Al_2O_3$).

Figure 13:
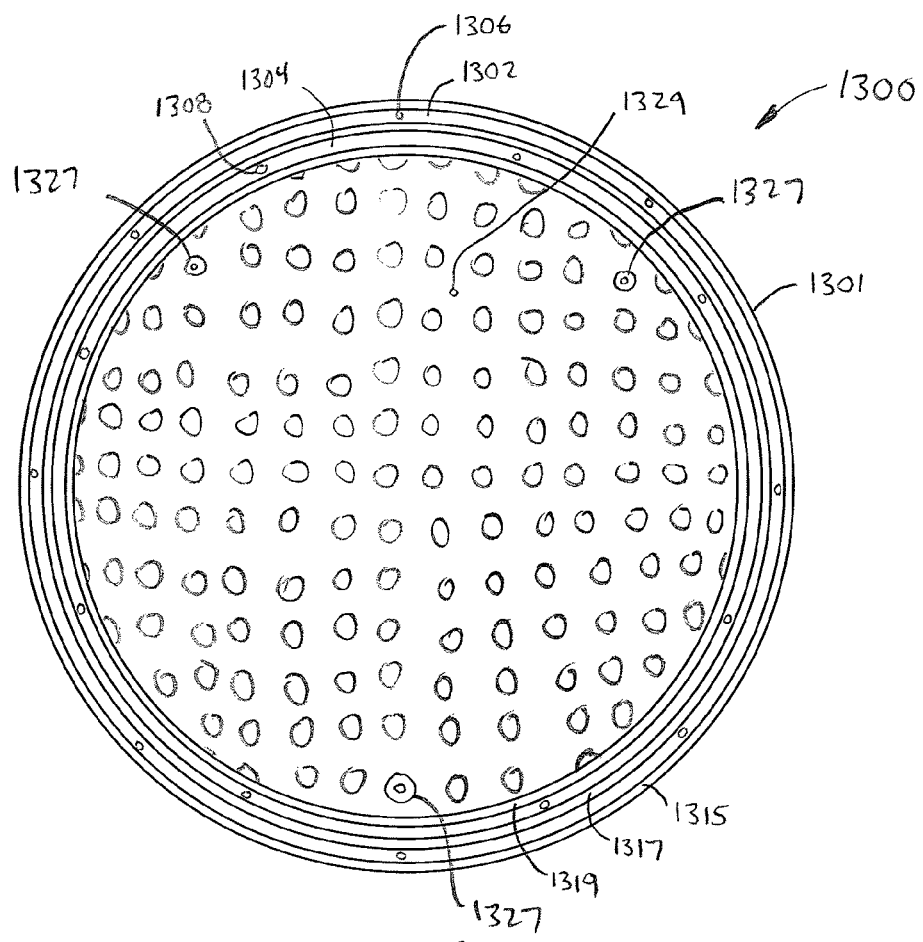
FIG. 13 depicts a top view of an electrostatic chuck in accordance with some embodiments of the invention.
Figure 17:
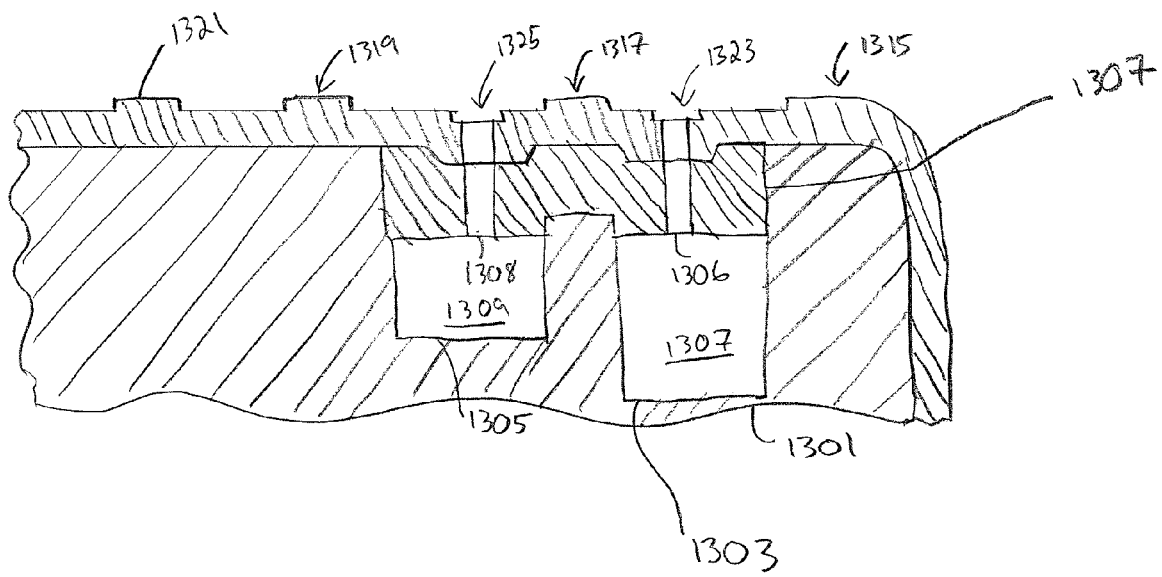
FIG. 17 depicts a partial cross-sectional view of an electrostatic chuck in accordance with some embodiments of the invention.
Figure 19:
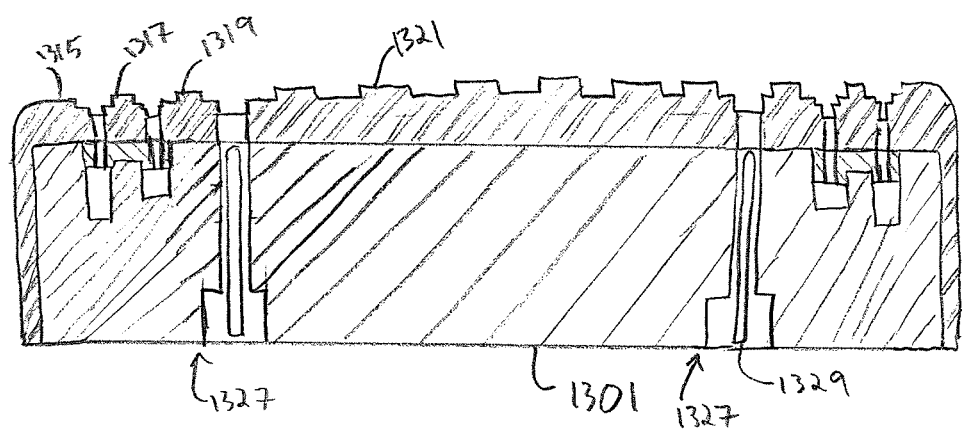
FIG. 19 depicts a cross-sectional view of an electrostatic chuck in accordance with the embodiments depicted in FIG. 13.

The manufacturing methods discussed above may be utilized to form an electrostatic chuck, for example, the electrostatic chuck 1300 which is illustrated in top view in FIG. 13 and in cross sectional views in FIGS. 17 and 19. The electrostatic chuck 1300 includes an electrically conductive body 1301 having one or more channels (for example, an outer channel 1303 and an inner channel 1305) formed in an upper surface thereof. In some embodiments, the inner and outer channels may be disposed proximate a peripheral edge of the body 1301. The body 1301 may comprise aluminum or another suitable conductive material.

The electrostatic chuck 1300 includes a plate 1307 positioned within one or more channels (e.g., the outer channel 1303 and the inner channel 1305) to define one or more plenums (e.g., an outer plenum 1309 and an inner plenum 1311) between the body 1301 and the plate 1307. In some embodiments, the surfaces of the outer plenum 1309 and the inner plenum 1311 are anodized. The plate 1307 may comprise aluminum or another suitable conductive material.

The electrostatic chuck 1300 includes one or more fluid passages (e.g., an outer fluid passage 1306 and an inner fluid passage 1308) disposed through the plate 1307. The outer and inner fluid passages 1306, 1308 fluidly couple the outer and inner plenums 1307, 1309 respectively to the upper surface of the body 1301. The surfaces of the outer and inner fluid passages are electrically insulated, for example, by any one or a combination of anodizing the surfaces of each fluid passage, inserting a dielectric tube into each fluid passage, or inserting a porous dielectric insert into each fluid passage.

As illustrated in top view in FIG. 13, an outer plurality 1302 of fluid passages 1306 and an inner plurality 1304 of fluid passages 1308 are formed in the electrostatic chuck 1300. The inner and outer fluid passages may be staggered as shown, or alternatively may be aligned. In some embodiments, the outer plurality comprises about 20 to about 60, or about 24 outer fluid passages and the inner plurality comprises about 10 to about 36, or about 18 inner fluid passages. In some embodiments, a diameter of an inner or outer fluid passage is illustratively between about 0.018 to about 0.020 mils, or about 0.019 mils.

The electrostatic chuck 1300 includes a dielectric layer 1313 disposed over the upper surface of the body 1301 and the plate 1307, where the dielectric layer 1313 forms a support surface for a substrate to be disposed thereon. The dielectric layer 1313 may comprise aluminum oxide ($Al_2O_3$) or any suitable dielectric material. In some embodiments, the dielectric layer is deposited to a thickness of about 0.254 mils, plus or minus about 0.0254 mils.

The dielectric layer 1313 may be treated as discussed above to form a plurality of embossed features in an upper surface of the dielectric layer. Embossed features may include a rib 1315 disposed about a peripheral edge of the body, a rib 1317 disposed about the body 1301 between the inner and outer pluralities of fluid passages, and a rib 1319 where the inner plurality of fluid passages is disposed between the rib 1317 and the rib 1319. The ribs 1315, 1317, and 1319 define outer and inner gas zones corresponding to outer and inner plenums and fluid passages.

The dielectric layer may further include dimples 1321 disposed between a central portion of the body 1301 and the rib 1319. The dimples 1321 may have a substantially flat upper surface for supporting a substrate and a cross section having a smoothly varying peripheral edge in a plane parallel to a surface of a substrate disposed on the electrostatic chuck 1300. The height of each rib and dimple may be substantially equivalent, or about 0.0178 mm. In some embodiments, a width of a dimple is about 3.8 mm. In some embodiments, a width of the rib 1317 is about 2.47 mm. In some embodiments, a width of the rib 1315 is about 2.43 mm. Interstitial spaces between the dimples may be filled with a gas, such as helium, during processing of a substrate via a gas hole 1329 formed through the body 1301 of the ESC.

The dielectric layer 1313 may further include groves (e.g., an outer grove 1323 and an inner grove 1325) disposed about the body 1301 and generally aligned with the inner and outer plurality of fluid passages. The inner and outer groves may correspond to recesses in the upper surface of the plate 1307 proximate each fluid passage as illustrated in FIG. 17.

Figure 18:
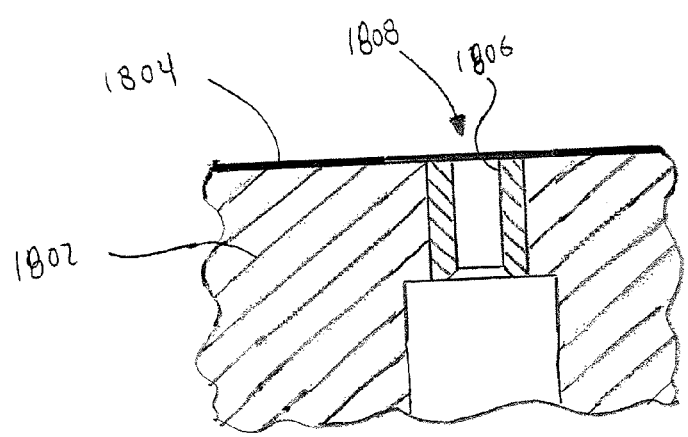
FIG. 18 depicts a partial cross-sectional view of a lift pin opening of an electrostatic chuck in accordance with some embodiments of the invention.

The electrostatic chuck 1300 may further include one or more lift pin holes 1327 disposed through the body 1301 and having anodized sidewalls. Each lift pin hole may include an upper portion and a lower portion, where a diameter of the lower portion exceeds a diameter of the upper portion. In some embodiments, both the sidewalls of the upper and lower portions are anodized. The lift pin holes may accommodate lift pins 1329 which may movably disposed within the lift pin holes 1327. The sidewalls of each lift pin hole 1327 are anodized to insulate surfaces of the body 1301 from the processing environment of the process chamber. Alternatively or in combination, a ceramic insert 1806 (e.g., a bushing) may be placed in an upper portion of each lift pin hole 1808 formed through the body 1802 of the ESC as illustrated in FIG. 18. 1804 depicts the dielectric overcoat (e.g., a dielectric layer formed over the surface of the body 1802).

Thus, electrostatic chucks and methods of manufacturing the same are provided herein. The inventive methods and apparatus may advantageously prevent and/or reduce arcing between the electrostatic chuck and a substrate disposed thereon and/or a plasma disposed in a processing environment of the chamber by electrically insulating exposed conductive surfaces of the electrostatic chuck. The inventive electrostatic chucks may include a variety of features which may reduce the incidence of likelihood of arcing in the electrostatic chuck (ESC) of the present invention over a conventional electrostatic chuck design. For example, the gas holes for inletting a gas to a channel formed in the ESC may be subject to a insulating treatment that reduces arcing, for example, such as anodizing a exposed surface of the gas hole, inserting a ceramic bushing in the gas hole, or inserting a porous ceramic material in the gas hole. An embossed surface of the ESC, which contacts the surface of a substrate to be disposed on the ESC, may have features that are rounded in the ESC of the present invention to prevent particle formation. Further, the lift pin holes may be subject to an insulating treatment that reduces arcing, for example, such as anodization of an exposed surface or the insertion of a ceramic bushel as discussed above in regards to the gas holes.

While the foregoing is directed to embodiments of the present invention, other and further embodiments of the invention may be devised without departing from the basic scope thereof.

The invention claimed is:

1. An electrostatic chuck for retaining a substrate, comprising:
   an electrically conductive body having one or more channels formed in an upper surface thereof;
   a single plate positioned within the one or more channels to define one or more plenums between the body and the plate, wherein the surfaces of the plenum are anodized, wherein the one or more channels further include an outer channel and an inner channel disposed proximate a peripheral edge of the body, and wherein the outer channel forms an outer plenum with the plate and the inner channel forms an inner plenum with the plate;
   one or more fluid passages disposed in the plate and fluidly coupling the one or more plenums to the upper surface of the body, wherein the surfaces of the fluid passages are electrically insulated; and
   a dielectric layer disposed over the upper surface of the body and the plate, wherein the dielectric layer forms a support surface for a substrate to be disposed thereon, and wherein the one or more fluid passages are positioned to distribute a fluid to a back surface of the substrate when disposed on the support surface.

2. The electrostatic chuck of claim 1, wherein the surfaces of the fluid passages are electrically insulated by one or more of the following:
   having anodized surfaces of the fluid passages;
   having a dielectric tube disposed in each fluid passage and axially aligned therewith, wherein the dielectric tube comprises a first end, a second end, and an axial through hole; or
   having a porous dielectric insert each fluid passage, wherein the insert is sufficiently porous to allow a fluid to pass therethrough.

3. The electrostatic chuck of claim 1, wherein the one or more fluid passages further comprise:
   an outer plurality of fluid passages fluidly coupled to the outer plenum; and
   an inner plurality of fluid passages fluidly coupled to the inner plenum.

4. The electrostatic chuck of claim 3, wherein the outer plurality comprises about 20 to about 60 fluid passages and the inner plurality comprises about 10 to about 36 fluid passages.

5. The electrostatic chuck of claim 1, wherein a diameter of each fluid passage is between about 0.018 to about 0.020 mils.

6. The electrostatic chuck of claim 1, wherein the body and the plate comprise aluminum.

7. The electrostatic chuck of claim 1, further comprising:
   one or more lift pin holes disposed through the body and having anodized sidewalls and/or a ceramic bushing disposed therein for a lift pin to travel therethrough.

8. The electrostatic chuck of claim 1, wherein the dielectric layer is aluminum oxide ($Al_2O_3$).

9. An electrostatic chuck for retaining a substrate, comprising:
   an electrically conductive body having a plurality of channels formed in an upper surface thereof;
   a single plate positioned within the plurality of channels to define one or more plenums between the body and the plate, wherein the surfaces of the plenum are anodized;
   one or more fluid passages disposed in the plate and fluidly coupling the one or more plenums to the upper surface of the body, wherein the surfaces of the fluid passages are electrically insulated;
   a dielectric layer disposed over the upper surface of the body and the plate, wherein the dielectric layer forms a support surface for a substrate to be disposed thereon, and wherein the one or more fluid passages are positioned to distribute a fluid to a back surface of the substrate when disposed on the support surface; and
   a plurality of embossed features extending upward from an upper surface of the dielectric layer, wherein each embossed feature has a cross section having a smoothly varying peripheral edge disposed atop the dielectric layer, wherein the smoothly varying peripheral edge of at least some of the embossed features form an outlet portion of at least some of the one or more fluid passages.

10. The electrostatic chuck of claim 9, wherein a diameter of the cross section is about 3.8 mm.

11. An apparatus for processing a substrate, comprising:
    a chamber defining a process region;
    an electrostatic chuck for retaining a substrate in the process region, the electrostatic chuck comprising:
      an electrically conductive body having one or more channels formed in an upper surface thereof;
      a single plate positioned within the one or more channels to define one or more plenums between the body and the plate, wherein the surfaces of the plenum are anodized, wherein the one or more channels further include an outer channel and an inner channel disposed proximate a peripheral edge of the body, and wherein the outer channel forms an outer plenum with the plate and the inner channel forms an inner plenum with the plate;
      one or more fluid passages disposed in the plate and fluidly coupling the one or more plenums to the upper surface of the body, wherein the surfaces of the fluid passages are electrically insulated; and
      a dielectric layer disposed over the upper surface of the body and the plate, wherein the dielectric layer forms a support surface for a substrate to be disposed thereon, and wherein the one or more fluid passages are positioned to distribute a fluid to a back surface of the substrate when disposed on the support surface.

12. The apparatus of claim 11, wherein the fluid passages have anodized sidewalls.

13. The apparatus of claim 11, further comprising:
    one or more lift pin holes disposed through the body and having anodized sidewalls and/or a ceramic bushing disposed therein for a lift pin to travel therethrough.

14. The apparatus of claim 11, the dielectric layer further comprising:
    a plurality of embossed features extending from an upper surface of the dielectric layer, wherein each embossed feature has a cross section having a smoothly varying peripheral edge in a plane parallel to the surface of a substrate disposed atop the dielectric layer.

* * * * *